United States Patent
Tawara et al.

(10) Patent No.: US 10,868,122 B2
(45) Date of Patent: Dec. 15, 2020

(54) SILICON CARBIDE SEMICONDUCTOR DEVICE AND A METHOD OF MANUFACTURING THE SILICON CARBIDE SEMICONDUCTOR DEVICE

(71) Applicant: FUJI ELECTRIC CO., LTD., Kawasaki (JP)

(72) Inventors: Takeshi Tawara, Tsukuba (JP); Koji Nakayama, Tsukuba (JP); Yoshiyuki Yonezawa, Tsukuba (JP); Hidekazu Tsuchida, Yokosuka (JP); Koichi Murata, Yokosuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/427,844

(22) Filed: May 31, 2019

(65) Prior Publication Data

US 2019/0393312 A1   Dec. 26, 2019

(30) Foreign Application Priority Data

Jun. 25, 2018 (JP) ................................ 2018-120289

(51) Int. Cl.
*H01L 29/16* (2006.01)
*H01L 29/868* (2006.01)
*H01L 29/66* (2006.01)

(52) U.S. Cl.
CPC ...... *H01L 29/1608* (2013.01); *H01L 29/6606* (2013.01); *H01L 29/868* (2013.01)

(58) Field of Classification Search
CPC ..................... H01L 29/1608; H01L 29/6606; H01L 29/868
See application file for complete search history.

(56) References Cited

U.S. PATENT DOCUMENTS

| | | | |
|---|---|---|---|
| 3,502,515 A * | 3/1970 | Brettner | H01L 21/00 438/508 |
| 5,814,546 A | 9/1998 | Hermansson | |
| 2018/0374918 A1* | 12/2018 | Nishio | H01L 29/1608 |

FOREIGN PATENT DOCUMENTS

| JP | 2005-276953 A | 10/2005 |
|---|---|---|
| JP | 4364945 B2 | 11/2009 |

OTHER PUBLICATIONS

Miyazawa et al., Vanadium Doping in 4H—SiC epitaxial growth for carrier lifetime control, Applied Physics Express, vol. 9, 111301, published Oct. 17, 2016.*

(Continued)

*Primary Examiner* — Peniel M Gumedzoe
(74) *Attorney, Agent, or Firm* — Rabin & Berdo, P.C.

(57) ABSTRACT

During epitaxial growth of an n⁻-type drift layer having a uniform nitrogen concentration, vanadium is doped in addition to the nitrogen, whereby an n⁻-type lifetime reduced layer is selectively formed in the n⁻-type drift layer. The n⁻-type lifetime reduced layer is disposed at a depth that is more than 5 μm from a pn junction surface between a p-type anode layer and the n⁻-type drift layer in a direction toward a cathode side, and the n⁻-type lifetime reduced layer is disposed separated from the pn junction surface. Further, the n⁻-type lifetime reduced layer is disposed in a range from the pn junction surface to a depth that is ⅓ times a thickness of the n⁻-type drift layer. A vanadium concentration of the n⁻-type lifetime reduced layer is 1/100 to 1/5 of a nitrogen concentration of the n⁻-type lifetime reduced layer.

4 Claims, 14 Drawing Sheets

(56) References Cited

OTHER PUBLICATIONS

E. Napoli et al., "Fast power rectifier design using local lifetime and emitter efficiency control techniques", Microelectronics Journal, (The Netherlands), Elsevier B.V., vol. 30, pp. 505-512, 1999.

K. Nakayama et al., "Low Loss 4H—SiC PiN Diode with Local Low Carrier Lifetime Region", Abstract of International Conference on Silicon Carbide and Related Materials 2017: Abstract of ICSCRM 2017, (USA), 2017, TH.D1.9.

* cited by examiner

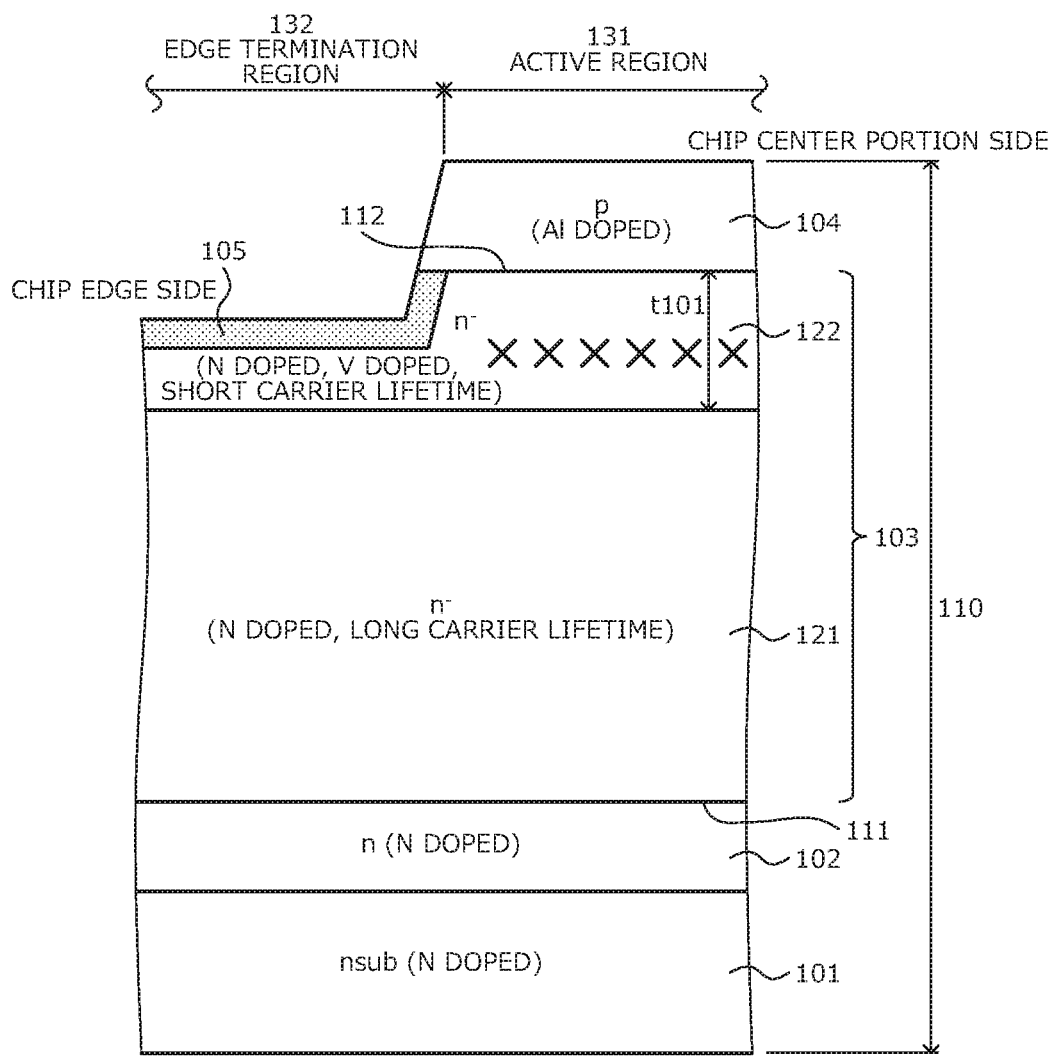

SILICON CARBIDE SEMICONDUCTOR DEVICE AND A METHOD OF MANUFACTURING THE SILICON CARBIDE SEMICONDUCTOR DEVICE

CROSS REFERENCE TO RELATED APPLICATIONS

This application is based upon and claims the benefit of priority of the prior Japanese Patent Application No. 2018-120289, filed on Jun. 25, 2018, the entire contents of which are incorporated herein by reference.

BACKGROUND OF THE INVENTION

1. Field of the Invention

Embodiments of the invention relate to a silicon carbide semiconductor device and a method of manufacturing the silicon carbide semiconductor device.

2. Description of the Related Art

Conventionally, in a p-intrinsic-n (pin) diode, conductance modulation occurs due to carriers (holes and electrons) injected from a p-type anode layer and an n-type cathode layer into an n-type drift layer (I layer) during energization (during forward bias), whereby drift resistance of the carriers decreases in the n-type drift layer. Further, by increasing the carrier lifetime of the n-type drift layer, the holes injected from the p-type anode layer into the n-type drift layer accumulate in the n-type drift layer, thereby enabling an even lower ON resistance due to electrons being pulled from n-type cathode layer to the n-type drift layer by the holes.

On the other hand, the large quantity of carriers injected into the n-type drift layer during forward bias increases the reverse recovery current at the time of switching (during reverse bias) and causes increased switching loss. As a method of solving this problem, a technique has been proposed where during epitaxial growth of the drift layer, an element (carrier lifetime killer) that forms effective recombination centers is doped (added to) in a portion of the drift layer, thereby making the portion of the drift layer a region having a short carrier lifetime, whereby the carrier lifetime of the drift layer is adjusted to a suitable value (for example, refer to Japanese Patent No. 4364945).

Further, regarding carrier lifetime control of the drift layer, a technique of improving the tradeoff of ON resistance reduction and reverse recovery current reduction at the time of switching by partially providing in the drift layer, a region having a short carrier lifetime that is made shorter than the carrier lifetime of the drift layer overall has been proposed (for example, refer to E. Napoli, et al., "Fast power rectifier design using local lifetime and emitter efficiency control techniques", Microelectronics Journal, (The Netherlands), Elsevier B. V., 1999, Vol. 30, p. 505-512; and K Nakayama, et al., "Low Loss 4H—SiC PiN Diode with Local Low Carrier Lifetime Region", Abstract of International Conference on Silicon Carbide and Related Materials 2017: Abstract of ICSCRM 2017, (USA), 2017, TH.D1.9).

FIG. 14 is a cross-sectional view of a structure of a conventional semiconductor device. The conventional semiconductor device depicted in FIG. 14 is an example of a pin diode in "Fast power rectifier design using local lifetime and emitter efficiency control techniques" (E. Napoli, et al.), a pin diode for which the tradeoff improvement effect is high and fabricated (manufactured) using a semiconductor substrate (semiconductor chip) 110 in which epitaxial layers constituting a n-type buffer layer 102, an n-type drift layer 103, and a p-type anode layer 104 are sequentially stacked on a front surface of an n-type starting substrate 101. The n-type starting substrate 101, the n-type buffer layer 102, and the n-type drift layer 103 are doped with nitrogen (N). The p-type anode layer 104 is doped with aluminum (Al).

Further, in the n-type drift layer 103, a portion (hereinafter, n-type lifetime reduced layer) 122 thereof adjacent to a pn junction surface (interface) 112 between the p-type anode layer 104 and the n-type drift layer 103 is doped with vanadium (V). "x"s depicted in a portion of the n-type lifetime reduced layer 122 represent an introduction of recombination centers by vanadium in the n-type lifetime reduced layer 122 overall. The carrier lifetime of the n-type drift layer 103 is shorter in the n-type lifetime reduced layer 122 than in a portion 121 other than the n-type lifetime reduced layer 122.

The n-type drift layer 103 has a nitrogen concentration that is uniform from an interface 111 between the n-type buffer layer 102 and the n-type drift layer 103 to the pn junction surface 112 between the p-type anode layer 104 and the n-type drift layer 103. An anode electrode (not depicted) is in contact with the p-type anode layer 104. A cathode electrode (not depicted) is in contact with a rear surface of the n-type starting substrate 101 that constitutes an n$^+$-type cathode layer. In FIG. 14, an edge termination structure 105 such as a junction termination extension (JTE) structure, a field limiting ring (FLR), etc. is depicted in a simplified manner.

Further, in FIG. 14, a conductivity type of the n-type starting substrate 101 is indicated by "nsub". Further, doping of the n-type starting substrate 101, the n-type buffer layer 102, and the n-type drift layer 103 with nitrogen as a dopant is indicated by "N doped". Doping of the n-type drift layer 103 with vanadium as a dopant is indicated by "V doped". Doping of the p-type anode layer 104 with aluminum as a dopant is indicated by "Al doped". Relative lengths of the carrier lifetime of the n-type drift layer 103 are indicated by "long carrier lifetime" and "short carrier lifetime".

Further, as a conventional pin diode, a device has been proposed in which an impurity is irradiated by an ion implantation method into an n-type drift layer or a p-type anode layer and defects induced in the n-type drift layer or the p-type anode layer are used to function as carrier lifetime killers (for example, refer to Japanese Laid-Open Patent Publication No. 2005-276953 (paragraphs 0009, 0018, FIG. 3)). In Japanese Laid-Open Patent Publication No. 2005-276953, energy of the ion implantation is selected and introduced so that a depth distribution center of the ion implanted impurity is within a range of 1 µm from the pn junction surface between the n-type drift layer and the p-type anode layer, on the n-type drift layer or p-type anode layer side, whereby the carrier lifetime is locally controlled.

SUMMARY OF THE INVENTION

According to an embodiment of the present invention, a silicon carbide semiconductor device has a pn junction surface through which forward current flows, the silicon carbide semiconductor device further including a first first-conductivity-type epitaxial layer made of silicon carbide containing, as an impurity, a first element that is a dopant of a first conductivity type; a second-conductivity-type epitaxial layer made of silicon carbide containing a dopant of a second conductivity type, the second-conductivity-type epitaxial layer having the pn junction surface between the second-conductivity-type epitaxial layer and the first first-conductivity-type epitaxial layer and supplying minority carriers to the first first-conductivity-type epitaxial layer; and a first-conductivity-type layer selectively provided in the first first-conductivity-type epitaxial layer and separated from the pn junction surface, the first-conductivity-type layer containing, as impurities, the first element and a second element that forms a recombination center. The first-conductivity-type layer is positioned at a first depth that is deeper than 5 μm from the pn junction surface in a direction toward the first first-conductivity-type epitaxial layer, and is disposed in a range from the pn junction surface to a second depth that is ⅓ times a thickness of the first first-conductivity-type epitaxial layer. The second element is vanadium. A concentration of the first element of the first-conductivity-type layer is equal to a concentration of the first element of the first first-conductivity-type epitaxial layer. A concentration of the second element of the first-conductivity-type layer is ¹⁄₁₀₀ to ⅕ of the concentration of the first element of the first first-conductivity-type epitaxial layer.

In the embodiment, the silicon carbide semiconductor device has the pn junction surface between the second-conductivity-type epitaxial layer and the first first-conductivity-type epitaxial layer.

In the embodiment, the silicon carbide semiconductor device further includes a second first-conductivity-type epitaxial layer between the pn junction surface and the first first-conductivity-type epitaxial layer, the second first-conductivity-type epitaxial layer containing more of the first element than does the first first-conductivity-type epitaxial layer. The silicon carbide semiconductor device has the pn junction surface between the second-conductivity-type epitaxial layer and the second first-conductivity-type epitaxial layer.

In the embodiment, the first first-conductivity-type epitaxial layer has a region that does not contain the second element and the region has a carrier lifetime that is at least 10 μs.

In the embodiment, a method of manufacturing the silicon carbide semiconductor device, includes applying a predetermined voltage between both surfaces of the first first-conductivity-type epitaxial layer, causing a depletion layer in the first first-conductivity-type epitaxial layer to spread; and obtaining a depth distribution of a first-conductivity-type doping concentration of the first first-conductivity-type epitaxial layer, based on an amount of change in capacitance of the depletion layer.

In the embodiment, the silicon carbide semiconductor device is any one of a PiN diode, a metal oxide semiconductor field effect transistor (MOSFET), an insulated gate bipolar transistor (IGBT), and a gate turn-off (GTO) thyristor.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 14 is a cross-sectional view of a structure of a conventional semiconductor device.

DETAILED DESCRIPTION OF THE INVENTION

Figure 1:
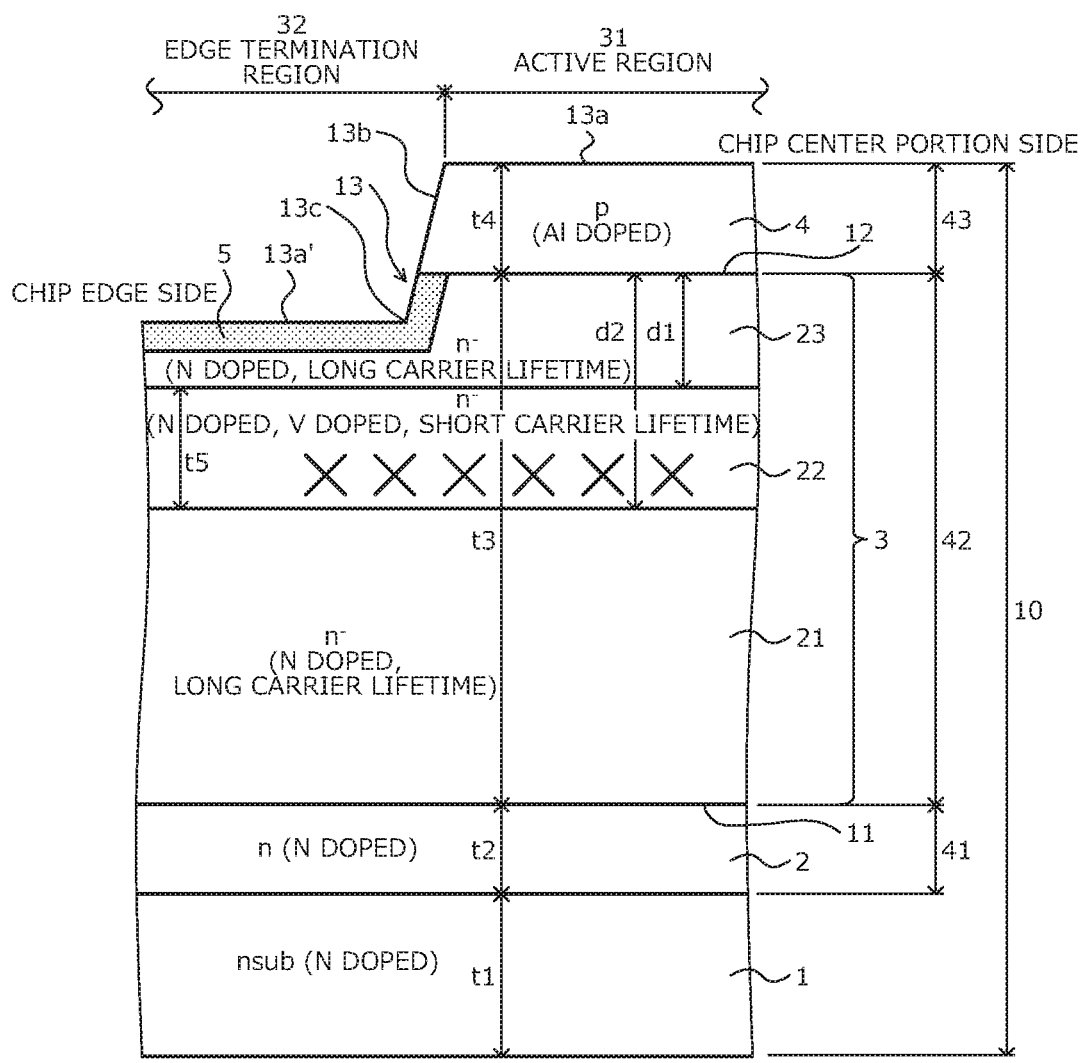
FIG. 1 is a cross-sectional view of a structure of a silicon carbide semiconductor device according to a first embodiment.

First, problems associated with the related arts will be discussed. With the conventional semiconductor device (refer to FIG. 14), in locally controlling the carrier lifetime of the n-type drift layer 103 and forming the n-type lifetime reduced layer 122 in the n-type drift layer 103, when the n-type lifetime reduced layer 122 has a thickness t101 that is thin, management (hereinafter, quality management) for determining whether the carrier lifetime of the n-type lifetime reduced layer 122 is set within an allowable range of the design value is difficult. For example, design values of the thickness t101, the nitrogen concentration, the vanadium concentration, and the carrier lifetime of the n-type lifetime reduced layer 122 in the n-type drift layer 103 are 10 μm, $3 \times 10^{14}/cm^3$, $1 \times 10^{13}/cm^3$, and 10 ns (nanoseconds), respectively.

In measurement of the carrier lifetime of the current state, although extinction time by recombination of carriers excited at the band edge by irradiation of excitation light such as laser or ultraviolet (UV) light is measured, since penetration length of the excitation light to the measured portion (the n-type lifetime reduced layer 122) is long, the average carrier lifetime of a portion having a thickness of several tens of μm and including the measured portion is regarded as the carrier lifetime of the measured portion. Deep ultraviolet (DUV) laser is used, whereby the penetration length of the excitation light to the measured portion may be shortened.

Nonetheless, when DUV laser is used, since the penetration length of the excitation light into the object to be measured is short, evaluation is limited to near the surface of the object to be measured. Further, when DUV laser is used, the average carrier lifetime has to be calculated with consideration of carrier diffusion and therefore, quality of the n-type lifetime reduced layer 122 becomes difficult to evaluate. Thus, the carrier lifetime of the n-type lifetime reduced layer 122 selectively formed in the n-type drift layer 103 has to be measured without damage to evaluate the quality of the n-type lifetime reduced layer 122.

Further, when an element that forms recombination centers is doped in the n-type drift layer 103, and a region that is adjacent to the pn junction surface 112 between the p-type anode layer 104 and the n-type drift layer 103 is regarded as the n-type lifetime reduced layer 122, the following problem occurs. In an edge termination region 132 that is between an active region 131 and a chip edge (side surface of the semiconductor substrate 110), near the pn junction surface 112 between the p-type anode layer 104 and the n-type drift layer 103, the edge termination structure 105 such as a FLR or a JTE structure constituted by a p-type region is selectively disposed in a surface layer at a front surface of the semiconductor substrate 110 by ion implantation of a p-type impurity such as aluminum.

In the edge termination region 132, since the n-type lifetime reduced layer 122 is exposed at the front surface of the semiconductor substrate 110, the p-type region constituting the edge termination structure 105 is selectively formed in the n-type lifetime reduced layer 122. The active region 131 is a region through which current flows in an ON state and is disposed at a chip center portion (center portion of the semiconductor substrate 110). The edge termination region 132 is a region between the active region 131 and the chip edge, and surrounds a periphery of the active region 131. The edge termination region 132 mitigates electric field of the n-type drift layer 103, on a chip front surface (the front surface of the semiconductor substrate 110) side and sustains the breakdown voltage (withstand voltage). The breakdown voltage is a voltage limit at which leak current is not excessively increased and neither destruction nor errant operation of an element occurs.

In this manner, when aluminum and an element (in particular, vanadium or the like) forming recombination centers are doped in a single layer (the n-type lifetime reduced layer 122), the aluminum and the element forming recombination centers are substituted at the same atomic sites (atomic positions), whereby the activation rate of the p-type regions constituting the edge termination structure 105 is adversely affected, possibly leading to a formation defect of the edge termination structure 105. Therefore, quality management (management for determining whether the carrier lifetime of the lifetime reduced layer of the n-type lifetime reduced layer 122 is set within an allowable range of the design value) has to be performed.

Further, in "Low Loss 4H—SiC PiN Diode with Local Low Carrier Lifetime Region" (K Nakayama, et al.), in the n⁻-type drift layer, provision of a low carrier lifetime layer at a position separated from the pn junction surface between the p-type anode layer and the n⁻-type drift layer, and use of vanadium as an example of an element doped in the low carrier lifetime layer are described. Nonetheless, in "Low Loss 4H—SiC PiN Diode with Local Low Carrier Lifetime Region" (K Nakayama, et al.), no method of managing whether the carrier lifetime of the low carrier lifetime layer is set within an allowable range of the design value is described.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of a silicon carbide (SiC) semiconductor device according to a first embodiment will be described. FIG. 1 is a cross-sectional view of a structure of the silicon carbide semiconductor device according to the first embodiment. FIG. 1 depicts a vicinity of a boundary an active region 31 and an edge termination region 32. The active region 31 is a region through which current flows in an ON state and is disposed at a chip center portion (center portion of a semiconductor substrate 10). The edge termination region 32 is a region that is between the active region 31 and a chip edge, and surrounds a periphery of the active region 31. The edge termination region 32 mitigates electric field of an n⁻-type drift layer 3, on a chip front surface (a front surface of the semiconductor substrate 10) side, and sustains the breakdown voltage (withstand voltage). The breakdown voltage is a voltage limit at which leak current is not excessively increased and neither destruction nor errant operation of an element occurs.

The silicon carbide semiconductor device according to the first embodiment and depicted in FIG. 1 is a pin diode fabricated (manufactured) using the semiconductor substrate (semiconductor chip) 10 in which epitaxial layers 41 to 43 constituting an n-type buffer layer 2, an n⁻-type drift layer (first-conductivity-type epitaxial layer) 3, and a p-type anode layer (second-conductivity-type epitaxial layer) 4, respectively, are sequentially stacked on a front surface of an n-type starting substrate 1 that constitutes an n-type cathode layer. In FIG. 1, "x"s depicted in a portion (in particular, a portion of a second n⁻-type layer 22 described hereinafter) of the n⁻-type drift layer 3 represent an introduction of recombination centers in the second n⁻-type layer 22 overall.

For example, nitrogen (N) is doped in (added to) the n-type starting substrate 1 and the n-type buffer layer 2 as an n-type impurity (n-type dopant). The n-type buffer layer 2 may be omitted. The first-conductivity-type epitaxial layer 3 in this embodiment is n⁻-type drift layer 3 and is constituted by first to third n⁻-type layers 21 to 23 (a first first-conductivity-type epitaxial layer 21; a second first-conductivity-type epitaxial layer 22; and a third first-conductivity-type epitaxial layer 23) that are between the n-type buffer layer 2 and a p-type anode layer 4, and that are stacked sequentially in the order stated from the n-type buffer layer 2 as illustrated in FIG. 1. The n⁻-type drift layer 3 (the first to the third n⁻-type layers 21 to 23) is doped with, for example, nitrogen (first element) as an n-type impurity. The p-type anode layer 4 is doped with, for example, aluminum (Al) as a p-type impurity (p-type dopant).

The n-type starting substrate 1 may have a thickness t1 and a nitrogen concentration (nitrogen density) of, for example, about 350 μm and about $5 \times 10^{18}/cm^3$, respectively. The n-type buffer layer 2 may have a thickness t2 and a nitrogen concentration of, for example, about 5 μm and about $5 \times 10^{18}/cm^3$, respectively. The n⁻-type drift layer 3 may have, in the active region 31, a thickness t3 of, for example, about 150 μm. The thickness t3 of the n⁻-type drift layer 3 in the active region 31 is a length of a portion of the semiconductor substrate 10 in a depth direction, between the n-type buffer layer 2 and the p-type anode layer 4. The depth direction is a direction from the front surface of the semiconductor substrate 10 (surface on a side having the p-type anode layer 4) toward a rear surface (rear surface of the n-type starting substrate 1).

The n⁻-type drift layer 3 may have a nitrogen concentration of, for example, about $3 \times 10^{14}/\text{cm}^3$. The nitrogen concentration of the n⁻-type drift layer 3 is lower than the nitrogen concentration of the n-type starting substrate 1, the nitrogen concentration of the n-type buffer layer 2, and an aluminum concentration of the p-type anode layer 4. The nitrogen concentration of the n⁻-type drift layer 3 is uniform from an interface 11 between the n-type buffer layer 2 and the n⁻-type drift layer 3 to a pn junction surface (interface) 12 between the p-type anode layer 4 and the n⁻-type drift layer 3. In other words, nitrogen concentrations of the first to the third n⁻-type layers 21 to 23 are equal. The p-type anode layer 4 may have a thickness t4 of, for example, about 2 μm. The aluminum concentration (aluminum density) of the p-type anode layer 4 may be, for example, in a range from about $1 \times 10^{18}/\text{cm}^3$ to $1 \times 10^{20}/\text{cm}^3$.

Further, in the n⁻-type drift layer 3, the second n⁻-type layer (first-conductivity-type layer) 22 that is doped with vanadium ((V) second element) as recombination centers is provided at a position that is separate from and deeper than a predetermined depth d1 from the pn junction surface 12 between the p-type anode layer 4 and the n⁻-type drift layer 3, in a direction toward a cathode (n-type cathode layer). A carrier lifetime (carrier lifetime) of the n⁻-type drift layer 3 is shorter in the second n⁻-type 22 than in a portion (i.e., the first and the third n⁻-type layers 21, 23) other than the second n⁻-type 22. Hereinafter, the second n⁻-type 22 will be described as the n⁻-type lifetime reduced layer 22. A carrier lifetime of the n⁻-type lifetime reduced layer 22 may be, for example, about 10 nanoseconds (ns). The carrier lifetime of the first and the third n⁻-type layers 21, 23 may be, for example, about 10 microseconds (μs) or more.

The n⁻-type lifetime reduced layer 22 is formed by so-called co-doping, that is, adding nitrogen (main element that is an n-type dopant) and vanadium (carrier lifetime killer) as impurities during epitaxial growth of the n⁻-type drift layer 3. In other words, after epitaxial growth of the first n⁻-type layer 21 that is formed by adding nitrogen alone, nitrogen and vanadium are added, and the n⁻-type lifetime reduced layer 22 is formed by epitaxial growth. Thereafter, subsequent to the epitaxial growth of the n⁻-type lifetime reduced layer 22, nitrogen alone is again added and the third n⁻-type layer 23 is formed by epitaxial growth. As a result, the n⁻-type drift layer 3 is formed in which the first n⁻-type layer 21, the n⁻-type lifetime reduced layer 22, and the third n⁻-type layer 23 are sequentially stacked. The nitrogen concentrations of the first and the third n⁻-type layers 21, 23 and of the n⁻-type lifetime reduced layer 22 are substantially equal.

The n⁻-type lifetime reduced layer 22 is disposed separated from the pn junction surface 12, at the depth d1 that is more than 5 μm from the pn junction surface 12 between the p-type anode layer 4 and the n⁻-type drift layer 3 in a direction toward the cathode (d1>5 μm). As a result, it was confirmed by the inventor that the tradeoff between reduction of the ON resistance and reduction of the reverse recovery current during switching is improved to a greater extent than conventionally. Furthermore, the n⁻-type lifetime reduced layer 22 is disposed within a range that from the pn junction surface 12 between the p-type anode layer 4 and the n⁻-type drift layer 3, covers a depth d2 that is ⅓ of the thickness t3 of the n⁻-type drift layer 3 (d1<d2≤t3/3) because when the n⁻-type lifetime reduced layer 22 has a thickness t5 that exceeds the described upper limit, as described hereinafter, the thickness t5 of the n⁻-type lifetime reduced layer 22 overall cannot be detected by capacitance-voltage (CV) measurement.

The thickness t5 of the n⁻-type lifetime reduced layer 22 is ¼ or less of the thickness t3 of the n⁻-type drift layer 3 (t5≤t3/4). The n⁻-type lifetime reduced layer 22 has a vanadium concentration (vanadium density) that is, for example, ¹⁄₁₀₀ to ⅕ of the nitrogen concentration of the n⁻-type lifetime reduced layer 22. When the vanadium concentration of the n⁻-type lifetime reduced layer 22 is below the lower limit described above, an effect due to the doping of vanadium is less likely to occur. When the vanadium concentration of the n⁻-type lifetime reduced layer 22 exceeds the upper limited described above, as described hereinafter, the n⁻-type lifetime reduced layer 22 is inverted to a p-type. In particular, the thickness t5 and the vanadium concentration of the n⁻-type lifetime reduced layer 22 may be, for example, about 7 μm and about $8 \times 10^{13}/\text{cm}^3$, respectively.

An n-type doping concentration of the n⁻-type lifetime reduced layer 22 is lower than an n-type doping concentration of the first and the third n⁻-type layers 21, 23. In other words, a portion in the n⁻-type drift layer 3 where the n-type doping concentration is lower is the n⁻-type lifetime reduced layer 22. Portions respectively adjacent to a cathode side and an anode side (a side facing toward the p-type anode layer 4) of the portion where the n-type doping concentration is lower in the n⁻-type drift layer 3 are the first and the third n⁻-type layers 21, 23, respectively. Therefore, a thickness (dimension in the depth direction), the n-type doping concentration, and a depth from the pn junction surface 12 between the p-type anode layer 4 and the n⁻-type drift layer 3, of the portion where the n-type doping concentration is lower in the n⁻-type drift layer 3 are detected by CV measurement, thereby enabling the thickness t5 of the n⁻-type lifetime reduced layer 22, vanadium concentration, and the depth d1 from the pn junction surface 12 between the p-type anode layer 4 and the n⁻-type drift layer 3 to be detected.

In FIG. 1, the conductivity type of the n-type starting substrate 1 is indicated by "nsub". Further, doping of nitrogen as a dopant in the n-type starting substrate 1, the n-type buffer layer 2, and the n⁻-type drift layer 3 is indicated by "N doped". Doping of vanadium as a dopant in the n⁻-type drift layer 3 is indicated by "V doped" and doping of aluminum as a dopant in the p-type anode layer 4 is indicated by "Al doped". Relative lengths of the carrier lifetime of the n⁻-type drift layer 3 are indicated as "long carrier lifetime" and "short carrier lifetime", respectively.

In the edge termination region 32, the p-type epitaxial layer 43 is removed spanning the edge termination region 32 entirely, whereby at the front surface 13a of the semiconductor substrate 10, a recess 13 (concave on the cathode side) at which the edge termination region 32 is lower than the active region 31 is formed. In the edge termination region 32, a front surface 13a' of the semiconductor substrate 10 is newly formed by the recess 13. At the front surface 13a' of the semiconductor substrate 10 in the edge termination region 32, the third n⁻-type layer 23 is exposed. The p-type epitaxial layer 43 and the third n⁻-type layer 23 may be removed to a predetermined depth at the time of formation of the recess 13.

The p-type epitaxial layer 43 may be removed from the edge termination region 32 to a portion on an outer side (side toward the chip edge) of the active region 31 and the recess 13 may be extended from the edge termination region 32 to the active region 31. In other words, a step 13b of the recess 13 may be positioned in the active region 31. The step 13b of the recess 13 is a connecting portion between the front surface 13a of the semiconductor substrate 10 (upper tier) in the active region 31 and the front surface 13a' of the semiconductor substrate 10 (lower tier) in the edge termination region 32. At the step 13b of the recess 13, an end of the pn junction surface 12 between the p-type anode layer 4 and the n⁻-type drift layer 3 is exposed.

In the edge termination region 32, in a surface layer at the front surface 13a' of the semiconductor substrate 10, plural p-type regions constituting a edge termination structure 5 such as a junction termination extension (JTE) structure, field limiting ring (FLR), etc. are selectively provided. In FIG. 1, while the edge termination structure 5 such as a junction termination extension (JTE) structure, a field limiting ring (FLR), etc. is depicted simplified as a single hatched region, when the edge termination structure 5 is a JTE structure, the plural p-type regions constituting the edge termination structure 5 are disposed adjacently to each other and when the edge termination structure 5 is a FLR, the plural p-type regions are disposed separated from each other.

In particular, the JTE structure has a structure in which the plural p-type regions of differing impurity concentrations are disposed adjacent to each other in concentric circles surrounding a periphery of the active region 31, so that the p-type regions are disposed in descending order of impurity concentration from nearest the active region 31 outward toward the chip edge. The FLR has structure in which the plural p-type regions are disposed separated from each other in concentric circles surrounding a periphery of the active region 31. In both the JTE structure and the FLR, an innermost p-type region constituting the edge termination structure 5 extends toward the active region 31, along the step 13b of the recess 13 and is in contact with the p-type anode layer 4 at the pn junction surface 12 between the p-type anode layer 4 and the n⁻-type drift layer 3.

The p-type regions constituting the edge termination structure 5 are provided at depths not reaching the n⁻-type lifetime reduced layer 22 from the front surface 13a' of the semiconductor substrate 10. Further, the p-type regions constituting the edge termination structure 5 cover a corner portion 13c of the recess 13. The corner portion 13c of the recess 13 is a boundary between the front surface 13a' of the semiconductor substrate 10 in the edge termination region 32 and the step 13b of the recess 13. During an OFF state of the pin diode, a depletion layer that spreads from the end of the pn junction surface 12 between the p-type anode layer 4 and the n⁻-type drift layer 3, outwardly toward the chip edge, spreads in the p-type regions constituting the edge termination structure 5, whereby breakdown voltage at the edge termination region 32 is sustained.

In a surface layer at the front surface 13a' of the semiconductor substrate 10 in the edge termination region 32, an n⁺-type stopper region (not depicted) is selectively provided closer to the chip edge than are the p-type regions constituting the edge termination structure 5, the n⁺-type stopper region being provided separated from the p-type regions. The n⁺-type stopper region is exposed at a side surface (i.e., the chip edge) of the semiconductor substrate 10. In the edge termination region 32, the front surface 13a' of the semiconductor substrate 10 is covered by a field oxide film (not depicted). An anode electrode (not depicted) is in contact with and electrically connected to the p-type anode layer 4. A cathode electrode (not depicted) is in contact with and electrically connected to the rear surface of the n-type starting substrate 1 that is the n⁺-type cathode layer.

Figure 2:
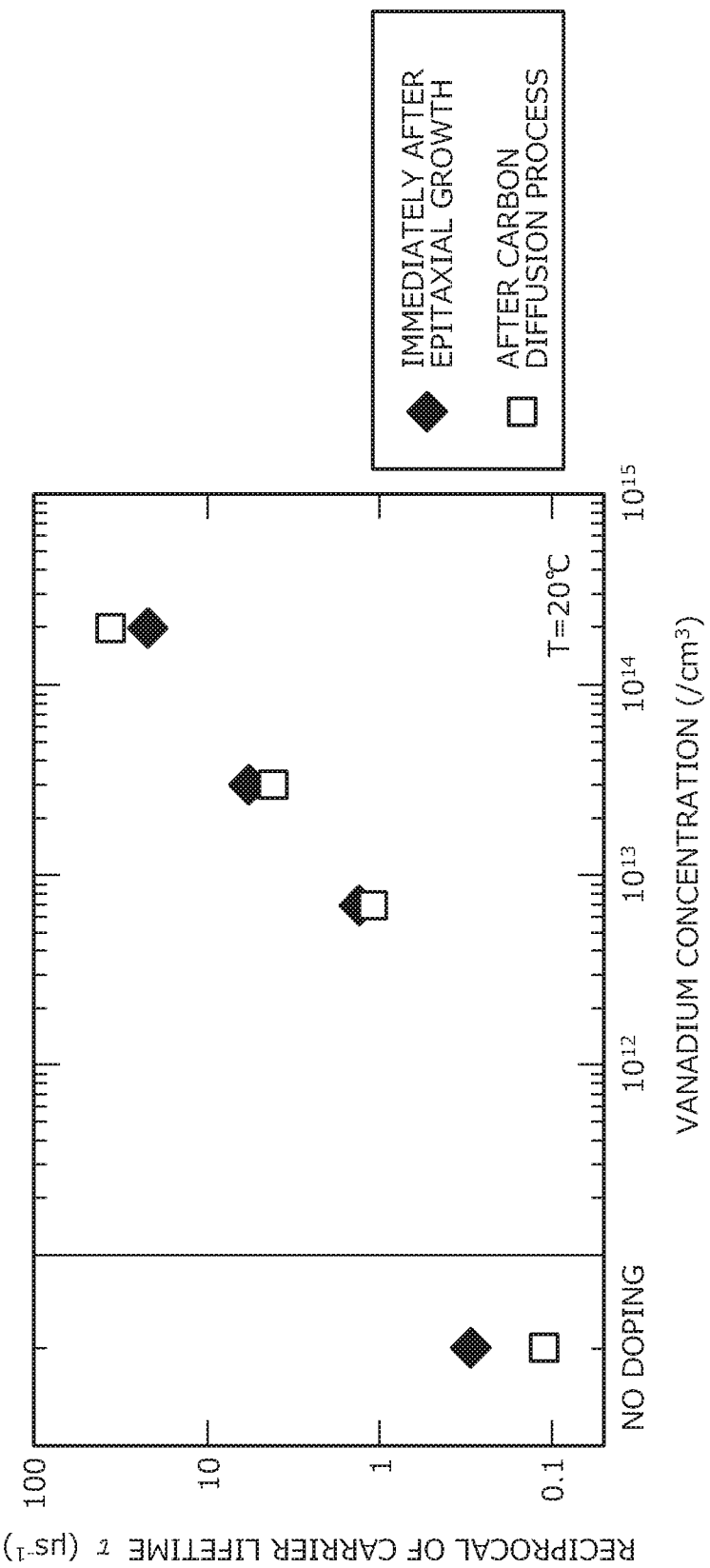
FIG. 2 is a characteristics diagram depicting a relationship between vanadium concentration and carrier lifetime of an n-type silicon carbide epitaxial layer.

A method of detecting the n⁻-type lifetime reduced layer 22 will be described. FIG. 2 is a characteristics diagram depicting a relationship between the vanadium concentration and the carrier lifetime of an n-type silicon carbide epitaxial layer. FIG. 2 depicts carrier lifetime τ of the silicon carbide epitaxial layer immediately after epitaxial growth and the carrier lifetime τ of the silicon carbide epitaxial layer after a process of introducing and diffusing carbon atoms by high-temperature thermal oxidation and thermal annealing (hereinafter, carbon diffusion process) is performed. The carbon diffusion process is a process of introducing and diffusing carbon atoms (interstitial atoms) between lattices of silicon carbide crystals of silicon carbide epitaxial layer and embedding crystal defects (carbon vacancies) by the carbon atoms, whereby crystal defects in the silicon carbide epitaxial layer are decreased and the carrier lifetime is extended, and in particular, is a step that is necessary when a high-voltage device of 10 kV or higher having a low ON resistance is fabricated.

In FIG. 2, the vanadium concentration [/cm³] of the silicon carbide epitaxial layer is shown on a horizontal axis and the carrier lifetime τ of the silicon carbide epitaxial layer is shown on a vertical axis as 1/τ (an inverse of the carrier lifetime τ) [μs⁻¹]. In FIG. 2, "no doping" on the horizontal axis indicates that vanadium is not doped in the silicon carbide epitaxial layer. Further, in FIG. 2, the greater is the value on a vertical axis, the shorter is the carrier lifetime τ of the silicon carbide epitaxial layer. Substrate temperature T during lifetime measurement is 20 degrees C. The substrate temperature is the temperature of the semiconductor substrate 10.

Figure 3:
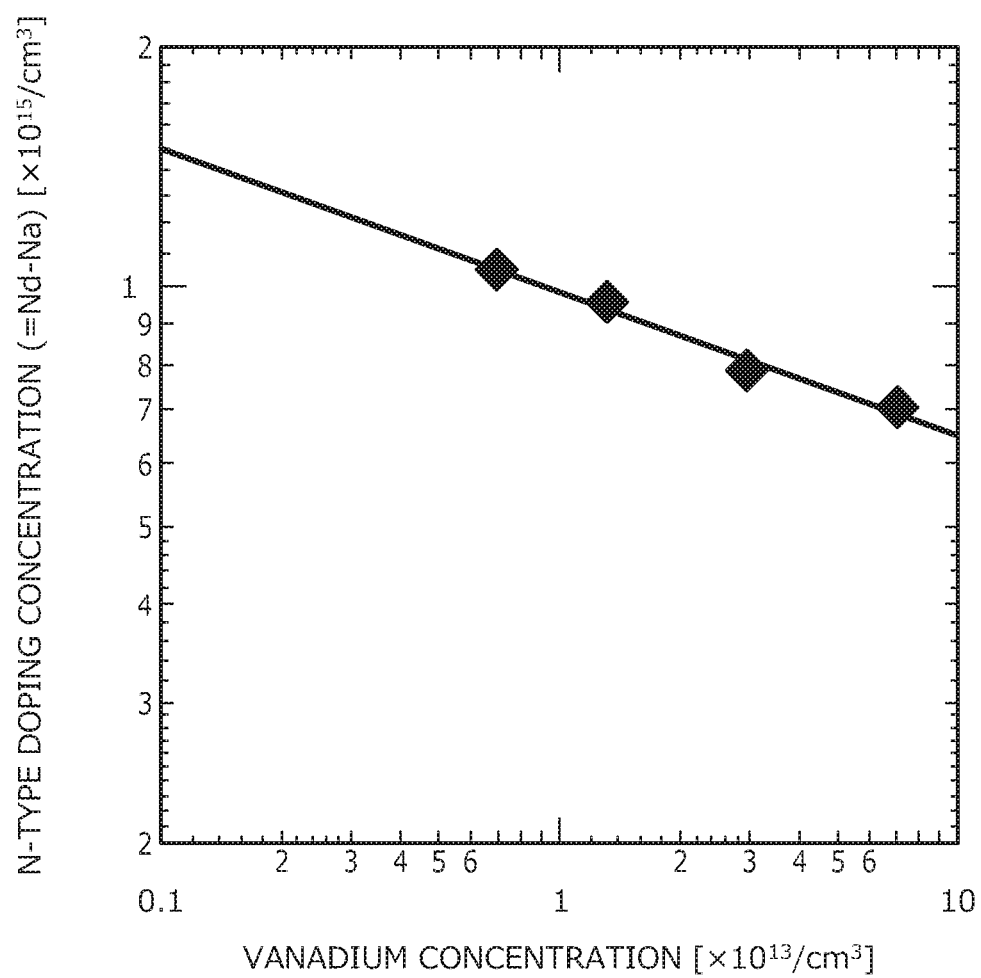
FIG. 3 is a characteristics diagram depicting a relationship between n-type doping concentration and the vanadium concentration of the n-type silicon carbide epitaxial layer.

FIG. 3 is a characteristics diagram depicting a relationship between the n-type doping concentration and the vanadium concentration of the n-type silicon carbide epitaxial layer. In FIG. 3, the vanadium concentration [×10¹³/cm³] of the n-type silicon carbide epitaxial layer is shown on a horizontal axis and a doping concentration [×10¹⁵/cm³] of the n-type silicon carbide epitaxial layer is shown on a vertical axis. The doping concentration of the n-type silicon carbide epitaxial layer is a concentration difference (=Nd—Na) obtained by subtracting an acceptor concentration (acceptor density) Na from donor concentration (donor density) Nd of the n-type silicon carbide epitaxial layer. The conductivity type of the n-type silicon carbide epitaxial layer is an n-type and therefore, in the n-type silicon carbide epitaxial layer, the donor concentration Nd is higher than the acceptor concentration Na (Nd—Na>0).

Figure 4:
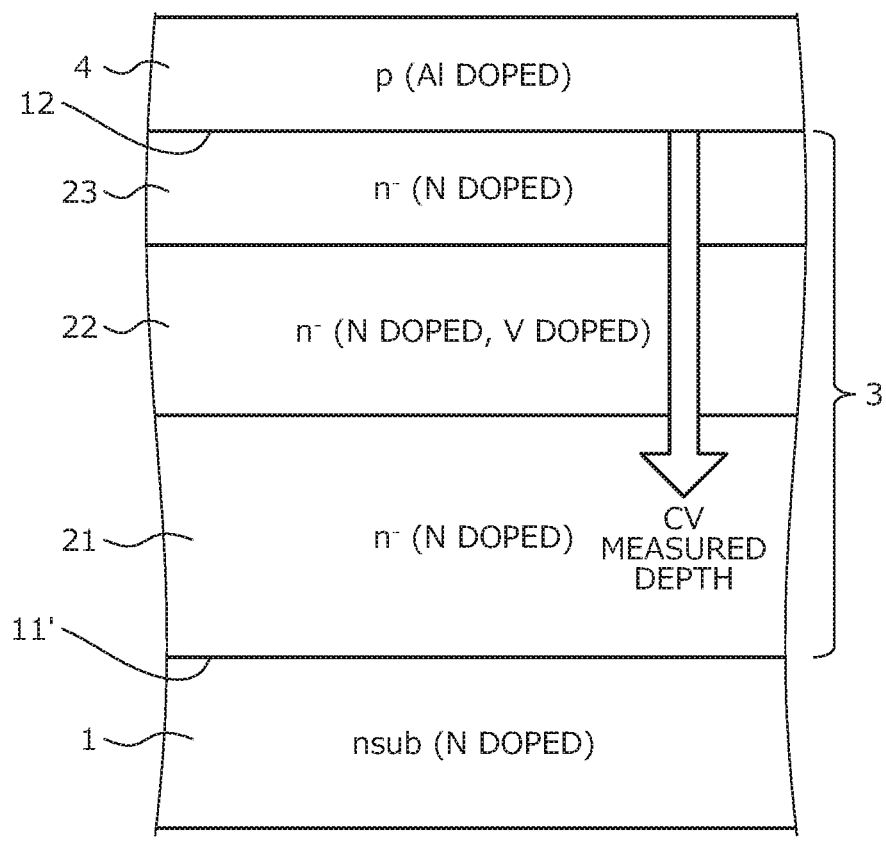
FIG. 4 is a diagram schematically depicting measured depths (CV measured depths) of doping concentrations.
Figure 5:
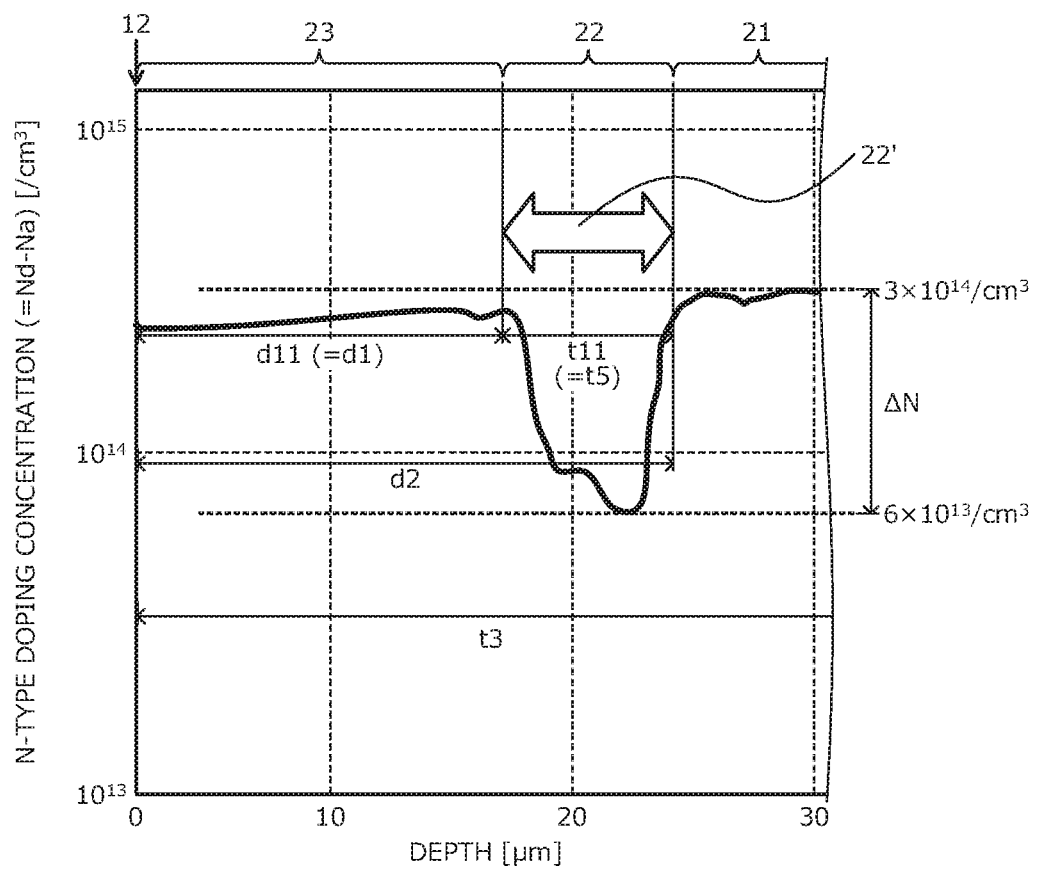
FIG. 5 is a characteristics diagram depicting depth distribution of the n-type doping concentration of an n-type drift layer measured by CV measurement.

FIG. 4 is a diagram schematically depicting measured depths (CV measured depths) of doping concentrations. FIG. 4 depicts an example in which no n-type buffer layer is provided. Reference numeral 11' is an interface between the n-type starting substrate 1 and the n⁻-type drift layer 3. In FIG. 4, parts identical to those in FIG. 1 are given the same reference numerals used in FIG. 1. FIG. 5 is a characteristics diagram depicting depth distribution of the n-type doping concentration of the n⁻-type drift layer measured by CV measurement. In FIG. 5, depth [μm] in the n⁻-type drift layer 3 from the pn junction surface 12 between the p-type anode layer 4 and the n⁻-type drift layer 3 (=0 μm) toward the n-type cathode layer (the n-type starting substrate 1) is shown on a horizontal axis. Further, in FIG. 5, the n-type doping concentration [/cm³] of the n⁻-type drift layer 3 is shown on a vertical axis.

Vanadium is known to form recombination centers in a silicon carbide epitaxial layer and reduce the carrier lifetime of the silicon carbide epitaxial layer. Further, the inventors, as depicted in FIG. 2, added vanadium to the silicon carbide epitaxial layer and thereby, discovered that the carrier lifetime τ of the silicon carbide epitaxial layer may be maintained at substantially the same low extent of the carrier lifetime τ immediately after epitaxial growth even after the carbon diffusion process. For example, when the nitrogen concentration of the nitrogen-doped n-type silicon carbide epitaxial layer is about $1\times10^{15}/cm^3$, the vanadium concentration of the n-type silicon carbide epitaxial layer suffices to be $6\times10^{12}/cm^3$ or higher.

The characteristics depicted in FIG. 2 indicate that carbon vacancies are not involved in the formation of recombination centers by vanadium and are desirable characteristics for achieving both the formation of recombination centers by vanadium and the extended carrier lifetime by the carbon diffusion process. Further, as depicted in FIG. 2, by the carbon diffusion process, the carrier lifetime of the n-type silicon carbide epitaxial layer with no vanadium doping is extended from 2 μs to 10 μs. In the carbon diffusion process, as a method of introducing carbon into the silicon carbide epitaxial layer, other than the high-temperature oxidation used in the experiment to obtain the characteristics in FIG. 2, carbon ion implantation may be used.

In the present invention, as described above, in the n⁻-type drift layer 3, the n⁻-type lifetime reduced layer 22 doped with nitrogen and vanadium is disposed at a position that is separated from the pn junction surface 12 between the p-type anode layer 4 and the n⁻-type drift layer 3 and deeper than the predetermined depth d1 in a direction toward the cathode side. Therefore, the vanadium concentration of the n⁻-type lifetime reduced layer 22 is variously changed and the carrier lifetime of the n⁻-type lifetime reduced layer 22 is controlled to be a carrier lifetime that is shorter than the carrier lifetimes of the first and the third n⁻-type layers 21, 23, whereby the carrier lifetime of the n⁻-type drift layer 3 may be controlled locally.

Further, the inventor confirmed that vanadium functions as an acceptor and compensates the n-type doping concentration of the silicon carbide epitaxial layer at a constant rate in a decreasing direction. In addition, as depicted in FIG. 3, it was confirmed that one vanadium atom doped in the silicon carbide epitaxial layer decreases the free electrons by four. Therefore, the vanadium concentration of the portion of the silicon carbide epitaxial layer doped with vanadium is obtained from the n-type doping concentration difference of a portion in which vanadium is doped and a portion in which vanadium is not doped in the silicon carbide epitaxial layer, and a rate (≈n-type doping concentration difference/4) at which vanadium decreases the n-type doping concentration of the silicon carbide epitaxial layer.

In particular, by obtaining a depth distribution of the n-type doping concentration of the n⁻-type drift layer 3, in the n⁻-type drift layer 3, the n-type doping concentration difference of the n⁻-type lifetime reduced layer 22 in which vanadium is doped and the first and the third n⁻-type layers 21, 23 in which vanadium is not doped may be obtained. Therefore, a value obtained by dividing the n-type doping concentration difference of the first and the third n⁻-type layers 21, 23 and the n⁻-type lifetime reduced layer 22 by four is substantially the vanadium concentration (≈[the n-type doping concentration difference of the first and the third n⁻-type layers 21, 23 and the n⁻-type lifetime reduced layer 22]/4) of the n⁻-type lifetime reduced layer 22.

In particular, in the n⁻-type drift layer 3, a portion (hereinafter, concentration compensated region) in which the n-type doping concentration is compensated in a decreasing direction by vanadium is the n⁻-type lifetime reduced layer 22. Therefore, as depicted in FIG. 4, the depth distribution of the n-type doping concentration of the n⁻-type drift layer 3 that extends to a predetermined depth in a direction from the pn junction surface 12 between the p-type anode layer 4 and the n⁻-type drift layer 3 toward the cathode side (direction indicated by arrow) is measured by CV measurement. By this CV measurement, as depicted in FIG. 5, in the n⁻-type drift layer 3, at a position separated from the pn junction surface 12 between the p-type anode layer 4 and the n⁻-type drift layer 3 by the predetermined depth d11, a concentration compensated region 22' of the n-type doping concentration by vanadium is detected.

The depth d11 of the concentration compensated region 22' from the pn junction surface 12 between the p-type anode layer 4 and the n⁻-type drift layer 3, the thickness t11 of the concentration compensated region 22', and an n-type doping concentration difference ΔN of the concentration compensated region 22' and a portion (the first and the third n⁻-type layers 21, 23) of the n⁻-type drift layer 3 other than the concentration compensated region 22' are obtained. The depth d11 and the thickness t11 are the depth d1 of the n⁻-type lifetime reduced layer 22 from the pn junction surface 12 between the p-type anode layer 4 and the n⁻-type drift layer 3 and the thickness t5 of the n⁻-type lifetime reduced layer 22. Additionally, from the n-type doping concentration difference ΔN, the vanadium concentration of the n⁻-type lifetime reduced layer 22 may be calculated.

In particular, for example, in the example depicted in FIG. 5, the n⁻-type lifetime reduced layer 22 is formed to the depth d2 that is about 7 μm (the thickness t5) from a depth position that is about 17 μm (the depth d1) from the pn junction surface 12 between the p-type anode layer 4 and the n⁻-type drift layer 3, in a direction toward the cathode side. The n-type doping concentration difference of portions of the n⁻-type drift layer 3 other than the concentration compensated region 22' and the concentration compensated region 22' is $24\times10^{13}/cm^3$ (=$3\times10^{14}[/cm^3]$-$6\times10^{13}[/cm^3]$). Therefore, $6\times10^{13}/cm^3$ (=$24\times10^{13}[/cm^3]/4$), which is about ¼ of the n-type doping concentration difference is the vanadium concentration of the concentration compensated region 22' (i.e., the vanadium concentration of the n⁻-type lifetime reduced layer 22).

When the thickness t5 of the n⁻-type lifetime reduced layer 22 is too thick, the thickness t5 of the n⁻-type lifetime reduced layer 22 overall is not detected by CV measurement and therefore, as described above, the upper limit of the thickness t5 of the n⁻-type lifetime reduced layer 22 is set. Further, when the vanadium concentration of the n⁻-type lifetime reduced layer 22 is too high, the n⁻-type lifetime reduced layer 22 is inverted into a p-type and therefore, the upper limit of the vanadium concentration of the n⁻-type lifetime reduced layer 22 is set as described above.

Between the n⁻-type lifetime reduced layer 22 and the pn junction surface 12 between the p-type anode layer 4 and the n⁻-type drift layer 3, the third n⁻-type layer 23 in which only nitrogen is doped and no vanadium is doped, is disposed in contact with the p-type anode layer 4 and the n⁻-type lifetime reduced layer 22. Therefore, for example, in the edge termination region 32, even when the edge termination structure 5 is disposed so as to be in contact with the pn junction surface 12 between the p-type anode layer 4 and the n⁻-type drift layer 3, variation of the activation rate of the p-type regions constituting the edge termination structure 5 may be avoided, enhancing device performance.

In the CV measurement, after the n⁻-type drift layer 3 is formed on the front surface of the n-type starting substrate 1 by epitaxial growth, mercury probe electrodes (first and second detection electrodes) are respectively put in contact with a surface (subsequently becoming a surface that is the pn junction surface 12 between the p-type anode layer 4 and the n⁻-type drift layer 3) of the n⁻-type drift layer 3 and the rear surface of the n-type starting substrate 1. Then, bias voltage of about a few hundred V is applied between the mercury probe electrodes so that negative voltage is applied to the n⁻-type drift layer 3 via the first detection electrode and positive voltage is applied to the n-type starting substrate 1 via the second detection electrode. In this manner, voltage is applied between the mercury probe electrodes, whereby a depletion layer in the n⁻-type drift layer 3 spreads from an interface (contact surface) between the mercury probe electrode and the n⁻-type drift layer 3.

When electrode contact with a rear surface (the rear surface of the n-type starting substrate 1) of the semiconductor substrate 10 is difficult, the first and the second detection electrodes may be put in contact with the surface of the n⁻-type drift layer 3. However, the contact surface area (surface area) of the second detection electrode through which positive voltage is applied and the n⁻-type drift layer 3 has to be set sufficiently larger than the contact surface area of the first detection electrode through which negative voltage is applied and the n⁻-type drift layer 3 and it is necessary for the depletion layer in the n⁻-type drift layer 3 to preferentially spread from the interface between the first detection electrode and the n⁻-type drift layer 3.

After application of the bias voltage between the mercury probe electrodes, when the depletion layer has spread from the interface between the first detection electrode and the n⁻-type drift layer 3 to a predetermined depth, the amount of change in the capacitance of the depletion layer is measured, thereby enabling the n-type doping concentration of the n⁻-type drift layer 3 at a predetermined depth to be calculated. Further, by changing the bias voltage applied between the mercury probe electrodes, the depth to which the depletion layer in the n⁻-type drift layer 3 spreads may be changed. Therefore, the bias voltage that is applied between the mercury probe electrodes is variously varied, thereby enabling distribution of the n-type doping concentration of the n⁻-type drift layer 3 to be obtained. In the distribution of the n-type doping concentration of the n⁻-type drift layer 3, the portion where the n-type doping concentration is lower is the concentration compensated region 22' in the n⁻-type drift layer 3. The depth d11 and the thickness t11 of the concentration compensated region 22' suffice to be set to the depth d1 and the thickness t5 of the n⁻-type lifetime reduced layer 22.

In the CV measurement, the larger is the voltage that is applied between the mercury probe electrodes, the deeper the measurement depth (CV measured depth) of the n-type doping concentration of the n⁻-type drift layer 3 may be set; however, the larger is the voltage that is applied between the mercury probe electrodes, the more likely the semiconductor device is to be destroyed. Therefore, with consideration of the breakdown voltage of the semiconductor device, the voltage to be applied between the mercury probe electrodes during CV measurement may be set to be about a few hundred V.

The silicon carbide semiconductor device according to the first embodiment, without limitation to a pin diode, is further applicable to a device having a pn junction through which forward current flows. In particular, for example, application to a parasitic pn junction diode (body diode) formed by a pn junction between a base region and a drift region of metal oxide semiconductor field effect transistor (MOSFET), a gate turn-off (GTO) thyristor and an insulated gate bipolar transistor (IGBT) is further possible.

Figure 6:
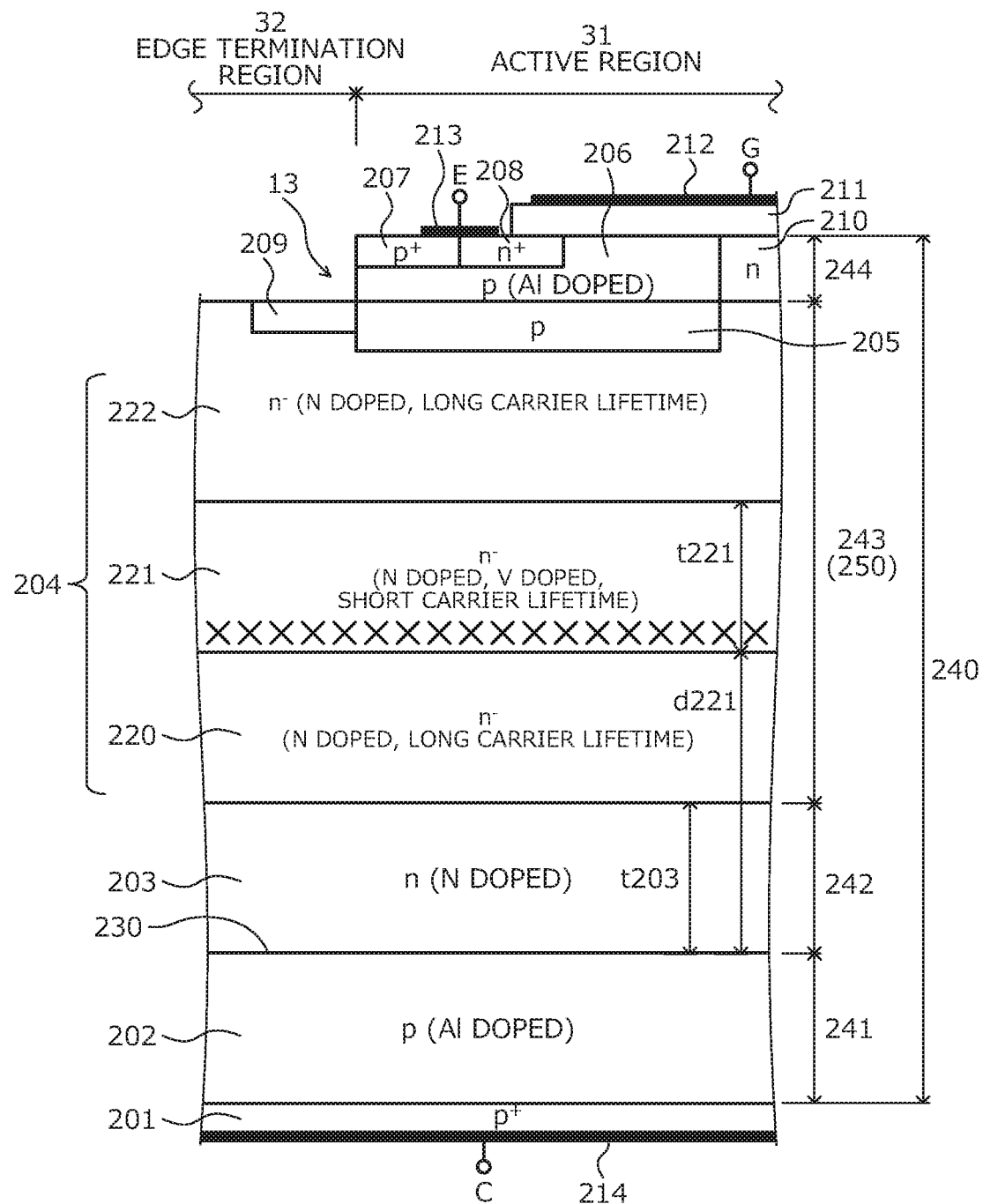
FIG. 6 is a cross-sectional view of a structure of the silicon carbide semiconductor device according to a second embodiment.

A structure of an IGBT to which the silicon carbide semiconductor device according to the first embodiment is applied will be described as the silicon carbide semiconductor device according to a second embodiment. FIG. 6 is a cross-sectional view of a structure of the silicon carbide semiconductor device according to the second embodiment. The silicon carbide semiconductor device according to the second embodiment and depicted in FIG. 6 is an IGBT to which the silicon carbide semiconductor device according to the first embodiment is applied and, for example, is fabricated (manufactured) using a semiconductor substrate 240 in which silicon carbide layers 241 to 244 respectively constituting a p-type collector layer 202, an n-type filed stop (FS) layer 203, an n⁻-type drift layer 204, and a p-type channel region 206 are sequentially formed by epitaxial growth.

In FIG. 6, doping of nitrogen as a dopant in the n-type field stop layer 203 and the n⁻-type drift layer 204 is indicated by "N doped". Doping of vanadium as a dopant in the n⁻-type drift layer 204 is indicated by "V doped". Doping of aluminum as a dopant in the p-type collector layer 202 and the p-type channel region 206 is indicated by "Al doped". Relative lengths of the carrier lifetime of the n⁻-type drift layer 204 are respectively indicated by "long carrier lifetime" and "short carrier lifetime".

In the n⁻-type drift layer 204, similarly to the first embodiment, a second n⁻-type layer (n⁻-type lifetime reduced layer) 221 is provided. Conditions of the carrier lifetimes of first to third n⁻-type layers 220 to 222 of the n⁻-type drift layer 204 are similar to those of the first to the third n⁻-type layers 21 to 23 in the first embodiment. In the second embodiment, the n⁻-type lifetime reduced layer 221 is provided at a position that is a certain distance (depth) d221 from a pn junction surface (interface) 230 between the p-type collector layer 202 and the n-type field stop layer 203, in a direction toward an emitter electrode 213. A reason for this is as follows.

The n-type field stop layer 203, to maintain the breakdown voltage of the IGBT, is provided having a doping concentration that is high as compared to the n⁻-type drift layer 204. When a lifetime reduced layer is present in the n-type field stop layer 203, the effect of reducing doping concentration by the vanadium element diminishes, whereby detection of the n⁻-type lifetime reduced layer 221 by CV measurement becomes difficult.

Thus, when the silicon carbide semiconductor device according to the first embodiment is applied to an IGBT, the n⁻-type lifetime reduced layer 221 suffices to be disposed at a position that from the pn junction surface 230 between the p-type collector layer 202 and the n-type field stop layer 203, is a distance at least equal to the thickness t203 of the n-type field stop layer 203, in a direction toward the emitter electrode 213. The n-type field stop layer 203, for example, is formed by epitaxial growth on an n⁻-type silicon carbide layer 243 constituting the n⁻-type drift layer 204 described hereinafter. The actual thickness t203 of the n-type field stop layer 203 is at least 5 μm based on constraints of film thickness control of epitaxial growth.

A front surface of the semiconductor substrate 240 is constituted by the p-type silicon carbide layer 244 constituting the p-type channel region 206 in the active region 31, and is constituted by the n⁻-type silicon carbide layer 243 constituting the third n⁻-type layer 222 of the n⁻-type drift layer 204 in the edge termination region 32. A rear surface of the semiconductor substrate 240 is constituted by the p-type silicon carbide layer 241 constituting the p-type collector layer 202. The p-type collector layer 202 is doped with, for example, aluminum as a p-type impurity. The n-type field stop layer 203 is doped with, for example, nitrogen as an n-type impurity. In the third n⁻-type layer 222, a p-type base region 205 is selectively provided in the active region 31.

At the front surface of the semiconductor substrate 240, the p-type silicon carbide layer 244 in the edge termination region 32 is removed, whereby similarly to the first embodiment, the recess 13 (concave on a collector side) at which the edge termination region 32 is lower than the active region 31 is formed. In the edge termination region 32, the third n⁻-type layer 222 of the n⁻-type drift layer 204 is exposed at the semiconductor substrate 240 by the recess 13. Similarly to the first embodiment, a edge termination structure 209 is provided in a surface layer of the third n⁻-type layer 222, the surface layer having a surface exposed in the edge termination region 32. Of plural p-type regions that constitute the edge termination structure 209, a p-type region that is closest to the active region 31 is in contact with the p-type base region 205.

In the p-type silicon carbide layer 244, an n-type junction FET (JFET) region 210 is selectively provided that penetrates the p-type silicon carbide layer 244 in the depth direction and reaches the third n⁻-type layer 222. A portion of the p-type silicon carbide layer 244 other than the n-type JFET region 210 constitutes the p-type channel region 206. The p-type channel region 206 opposes the p-type base region 205 in the depth direction and is in contact with the p-type base region 205. In the p-type channel region 206, a p⁺-type emitter contact region 207, and an n⁺-type emitter region 208 are each selectively provided separated from the n-type JFET region 210.

The n⁺-type emitter region 208 is disposed closer to the n-type JFET region 210 than is the p⁺-type emitter contact region 207. On a surface of a portion of the p-type channel region 206 between the n⁺-type emitter region 208 and the n-type JFET region 210, a gate electrode 212 is provided via a gate insulating film 211. The p⁺-type emitter contact region 207 and the n⁺-type emitter region 208 are in contact with the emitter electrode 213 and are at an electric potential E of the emitter electrode 213. In the p-type collector layer 202, a p⁺-type collector contact region 201 is provided. The p-type collector layer 202 is in contact with a collector electrode 214 via the p⁺-type collector contact region 201 and is at an electric potential C of the collector electrode 214.

Figure 7:
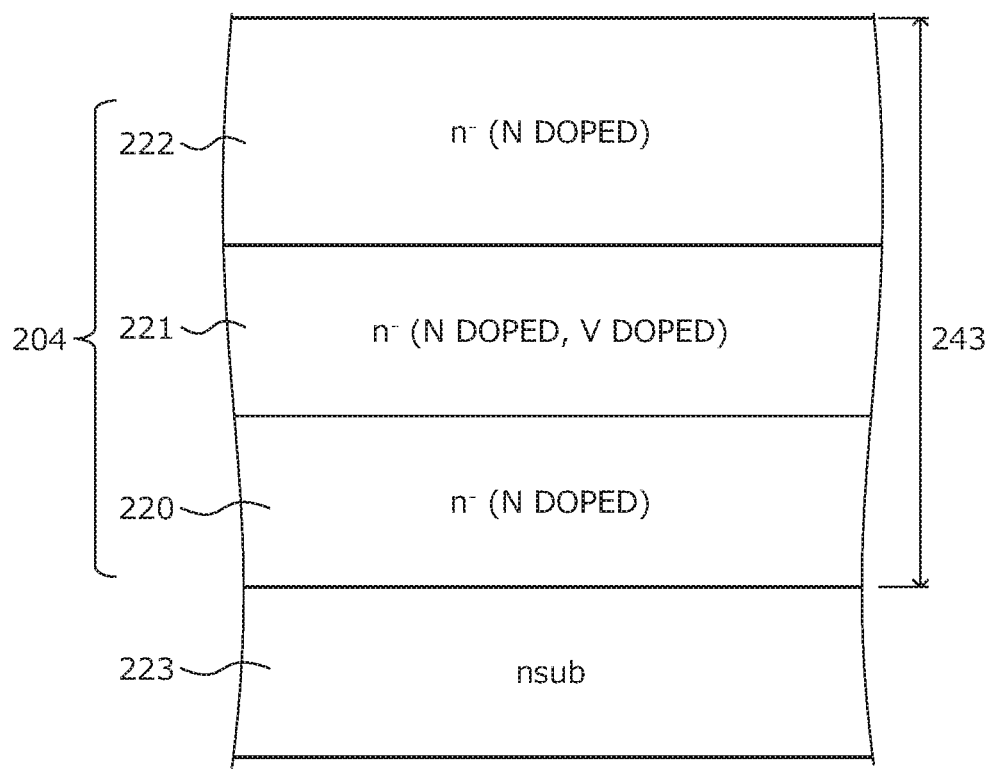
FIG. 7 is a cross-sectional view of the silicon carbide semiconductor device according to the second embodiment during manufacture.

A method of manufacturing the silicon carbide semiconductor device according to the second embodiment will be described with reference to FIGS. 7 to 12. FIGS. 7, 8, 9, 10, 11, and 12 are cross-sectional views of the silicon carbide semiconductor device according to the second embodiment during manufacture. In FIGS. 7 to 11, at a manufacturing step of the semiconductor substrate 240 for an IGBT, a technique of performing CV measurement for detecting the n⁻-type lifetime reduced layer 221 is depicted. As the n⁻-type drift layer 204, first, the first n⁻-type layer 220, the second n⁻-type layer (n⁻-type lifetime reduced layer) 221, and the third n⁻-type layer 222 are sequentially and successively formed by epitaxial growth on an n-type starting substrate 223, whereby the n⁻-type silicon carbide layer 243 is formed (FIG. 7). A method of forming the first to the third n⁻-type layers 220 to 222 is similar to that of the first embodiment.

Figure 8:
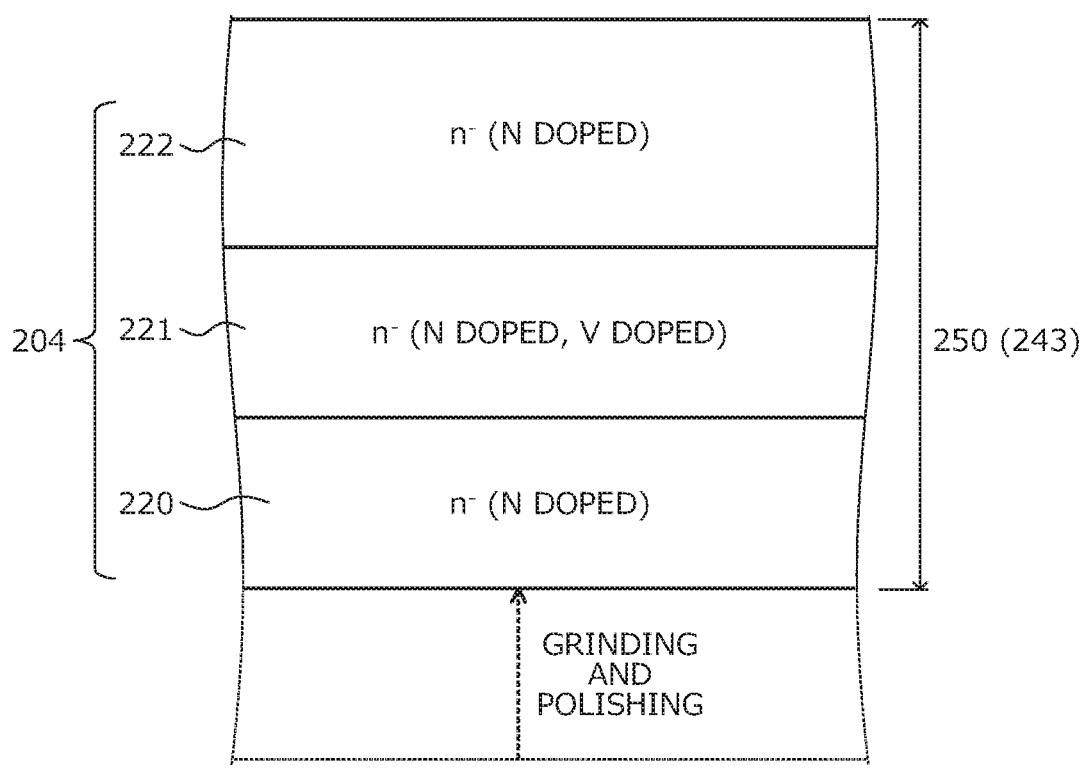
FIG. 8 is a cross-sectional view of the silicon carbide semiconductor device according to the second embodiment during manufacture.
Figure 9:
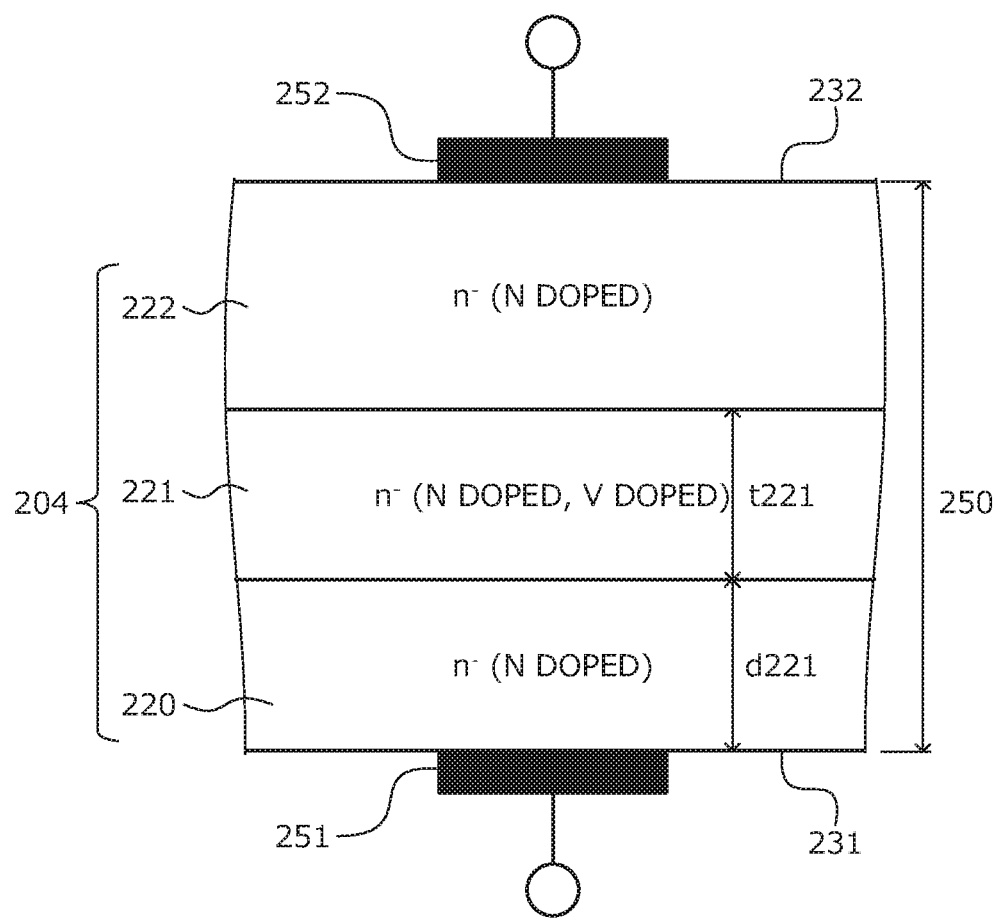
FIG. 9 is a cross-sectional view of the silicon carbide semiconductor device according to the second embodiment during manufacture.

Next, the n-type starting substrate 223 is removed by grinding and polishing (FIG. 8). As a result, the n⁻-type silicon carbide layer 243 is left as an epitaxial substrate 250 and has one main surface where a surface 231 of the first n⁻-type layer 220 is exposed and another main surface where a surface 232 of the third n⁻-type layer 222 is exposed. In this state, a first detection electrode 251 is put in contact with the surface 231 of the first n⁻-type layer 220 and a second detection electrode 252 is put in contact with the surface 232 of the third n⁻-type layer 222. Then, negative voltage is applied to the first n⁻-type layer 220 via the first detection electrode 251 and positive voltage is applied to the third n⁻-type layer 222 via the second detection electrode 252, whereby CV measurement is performed (FIG. 9).

In this manner, bias voltage is applied to the epitaxial substrate 250 that is between the first and the second detection electrodes 251, 252, whereby a depletion layer in the n⁻-type drift layer 204 spreads from an interface (the surface 231 of the first n⁻-type layer 220) between the first detection electrode 251 and the first n⁻-type layer 220. As a result, the thickness t221, the vanadium concentration, and the depth d221 from the surface 231 of the first n⁻-type layer 220 of the n⁻-type lifetime reduced layer 221 are detectable. After the CV measurement is performed, the first and the second detection electrodes 251, 252 are separated from the epitaxial substrate 250 and the epitaxial substrate 250 is cleaned.

Figure 10:
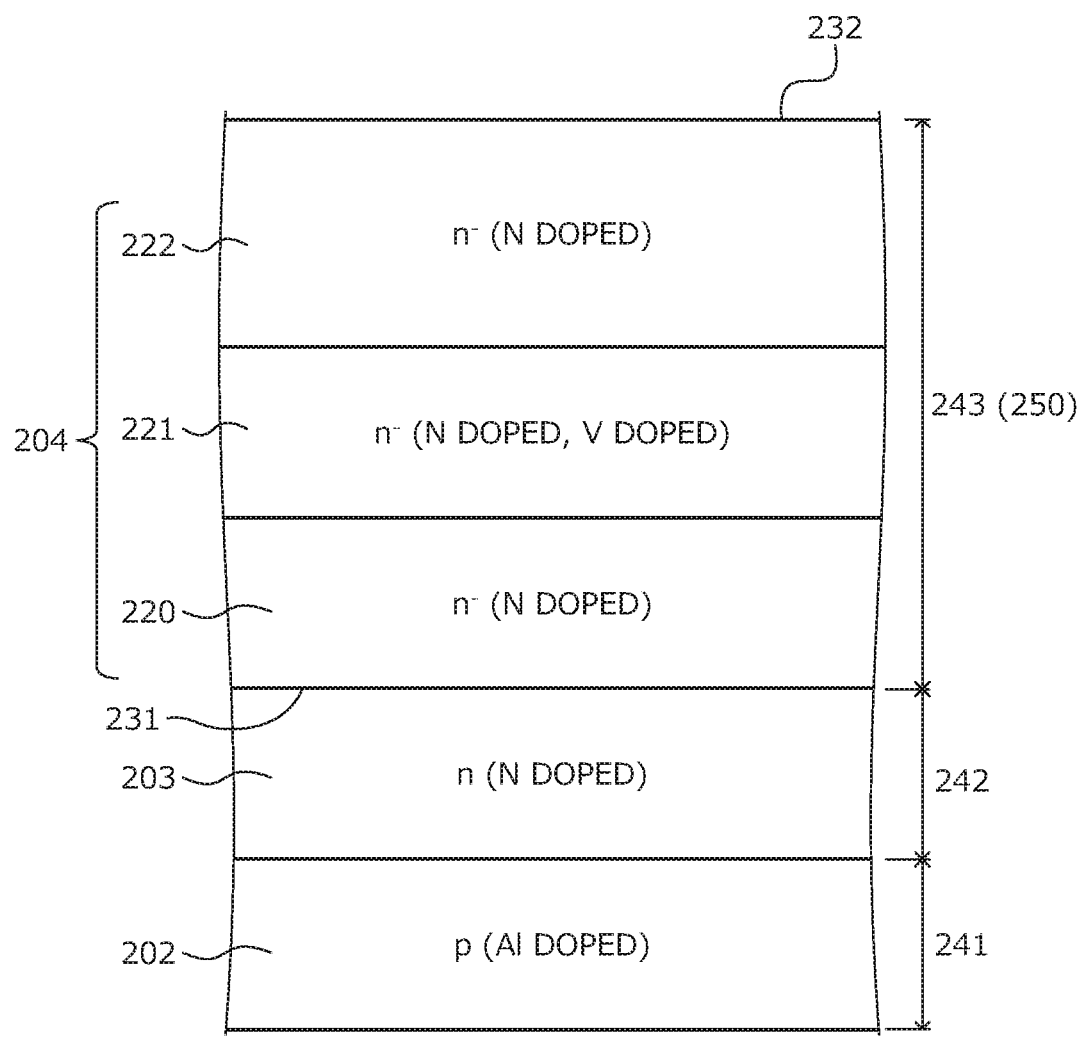
FIG. 10 is a cross-sectional view of the silicon carbide semiconductor device according to the second embodiment during manufacture.
Figure 11:
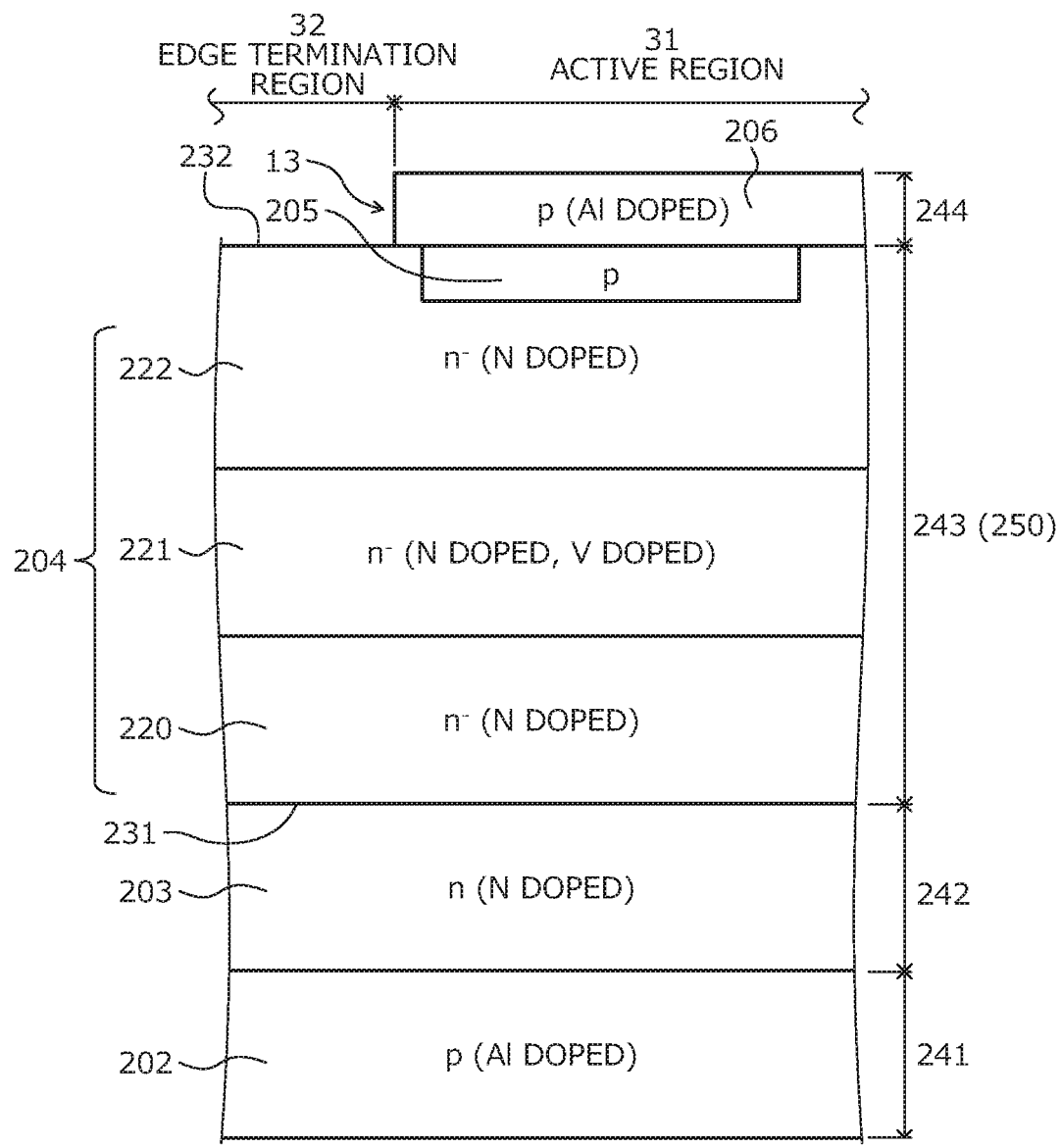
FIG. 11 is a cross-sectional view of the silicon carbide semiconductor device according to the second embodiment during manufacture.

Next, the silicon carbide layers 242, 241 constituting the n-type field stop layer 203 and the p-type collector layer 202 are sequentially formed on the surface 231 of the first n⁻-type layer 220 by epitaxial growth (FIG. 10). Next, in a region (surface layer) at the surface 232 of the third n⁻-type layer 222, the p-type base region 205 is selectively formed by photolithography process and ion implantation. Next, on the surface 232 of the third n⁻-type layer 222, the p-type silicon carbide layer 244 constituting the p-type channel region 206 is formed by epitaxial growth. Next, a portion of the p-type silicon carbide layer 244 is removed by a photolithography process and etching, thereby exposing the surface 232 of the third n⁻-type layer 222 in the edge termination region 32 (FIG. 11).

Next, a process that includes the photolithography process and ion implantation as one set is repeatedly performed, whereby in the edge termination region 32, plural p-type regions constituting the edge termination structure 209 are each selectively formed in the third n⁻-type layer 222. Next, a process that includes the photolithography process and ion implantation as one set is repeatedly performed, whereby the p⁺-type emitter contact region 207, the n⁺-type emitter region 208, and the n-type JFET region 210 are each selectively formed in the p-type silicon carbide layer 244. A portion of the p-type silicon carbide layer 244 other than these regions 207, 208, 210 constitutes the p-type channel region 206.

Figure 12:
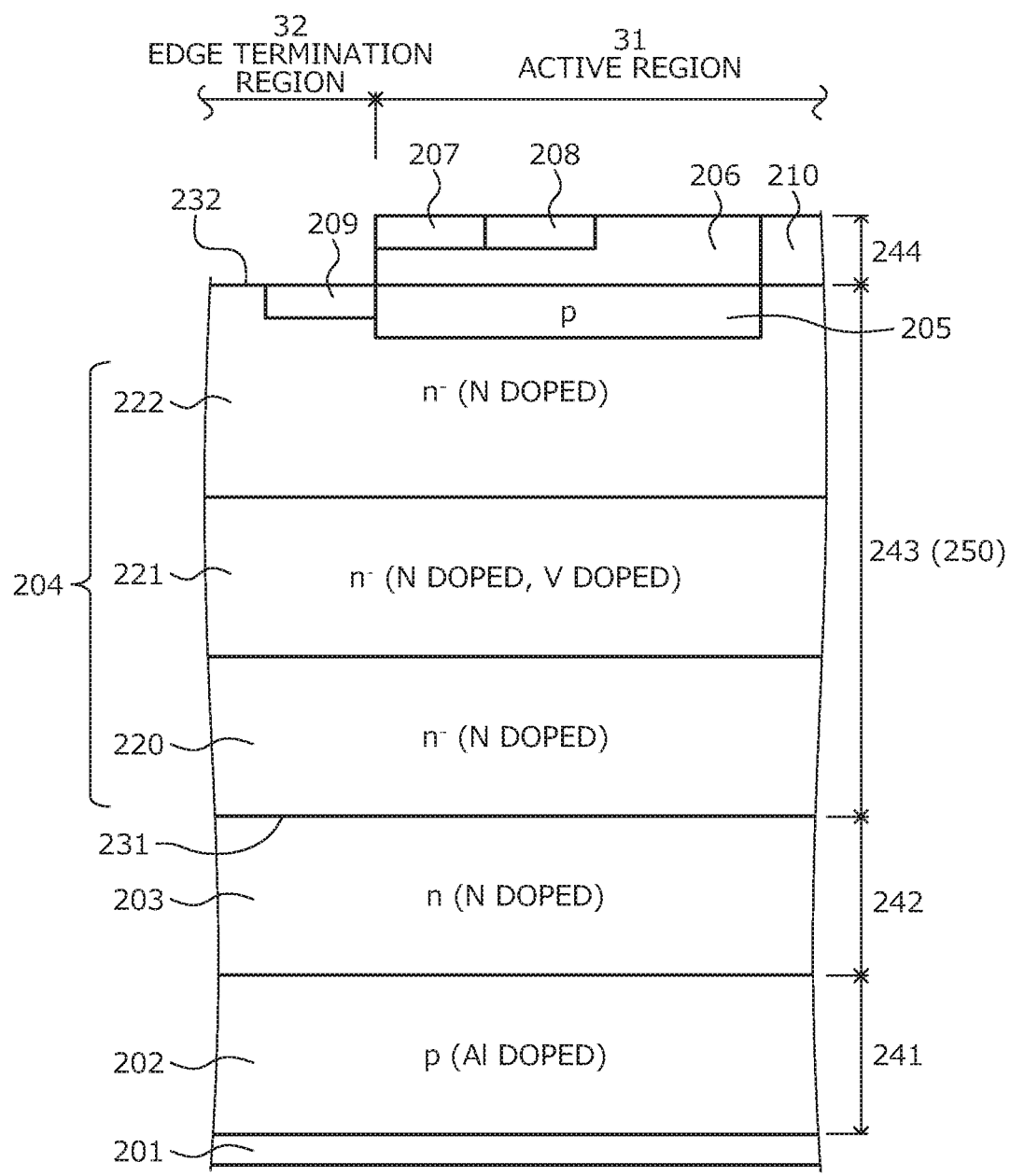
FIG. 12 is a cross-sectional view of the silicon carbide semiconductor device according to the second embodiment during manufacture.

Next, by a photolithography process and ion implantation, the p⁺-type collector contact region 201 is formed in a surface region of the p-type silicon carbide layer 241 that constitutes the p-type collector layer 202. Then, all the regions that are formed by ion implantation are activated by thermal activation annealing (heat treatment) in an argon atmosphere (FIG. 12). Next, in the edge termination region 32, a field oxide film (not depicted) that covers the surface 232 of the third n⁻-type layer 222 is formed. Next, the gate insulating film 211 is formed by thermal oxidation or deposition. Thereafter, by a general method, the gate electrode 212, an interlayer insulating film (not depicted), the emitter electrode 213, and the collector electrode 214 are formed, whereby the IGBT depicted in FIG. 6 is completed.

Figure 13:
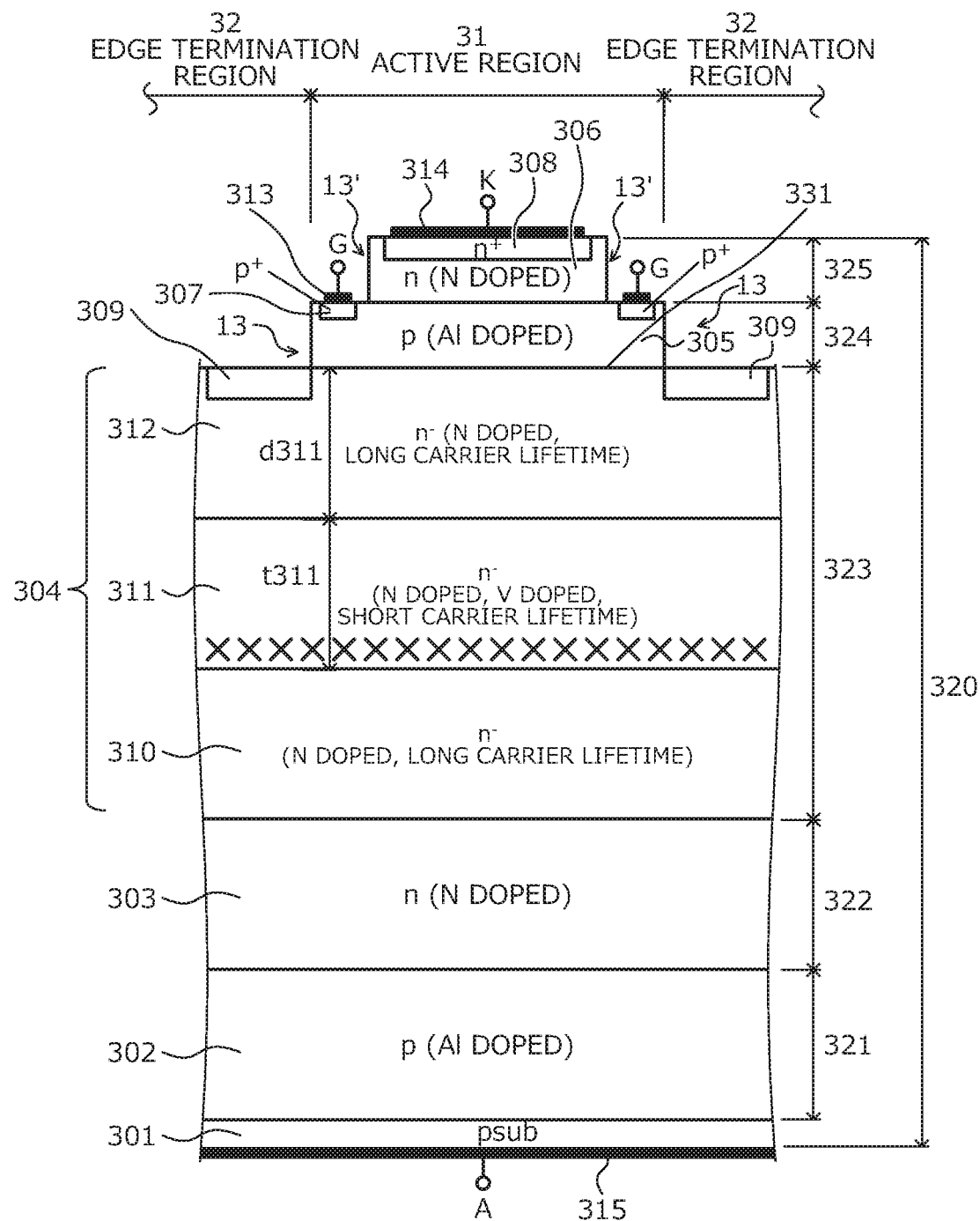
FIG. 13 is a cross-sectional view of a structure of the silicon carbide semiconductor device according to a third embodiment.

A structure of a GTO thyristor to which the silicon carbide semiconductor device according to the first embodiment is applied will be described as the silicon carbide semiconductor device according to a third embodiment. FIG. 13 is a cross-sectional view of a structure of the silicon carbide semiconductor device according to the third embodiment. The silicon carbide semiconductor device according to the third embodiment and depicted in FIG. 13 is a GTO thyristor to which the silicon carbide semiconductor device according to the first embodiment is applied and, for example, is fabricated (manufactured) using a semiconductor substrate 320 in which silicon carbide layers 321 to 325 constituting a first p-type layer 302, a first n-type layer 303, an n⁻-type drift layer 304, a second p-type layer 305, and a second n-type layer 306 are sequentially formed on a p-type starting substrate 301 by epitaxial growth.

In FIG. 13, the conductivity type of the p-type starting substrate 301 is indicated by "psub". Doping of nitrogen as a dopant in the first n-type layer 303, the n⁻-type drift layer 304, and the second n-type layer 306 is indicated by "N doped". Doping of vanadium as a dopant in the n⁻-type drift layer 304 is indicated by "V doped". Doping of aluminum as a dopant in the first and the second p-type layers 302, 305 is indicated by "Al doped". Relative lengths of carrier lifetimes of the n⁻-type drift layer 304 are respectively indicated by "long carrier lifetime" and "short carrier lifetime".

In the n⁻-type drift layer 304, similarly to the first embodiment, a second n⁻-type layer (n⁻-type lifetime reduced layer) 311 is provided. Conditions of the carrier lifetime of the first to the third n⁻-type layers 310 to 312 of the n⁻-type drift layer 304 are similar to those of the first to the third n⁻-type layers 21 to 23 in the first embodiment. In the third embodiment, an n⁻-type lifetime reduced layer 311 suffices to be provided at a position that in a direction toward the p-type starting substrate 301, is a certain distance (depth) d311 from a pn junction surface (interface) 331 in an npnp diode that constitutes the GTO thyristor. As a result, similarly to the first embodiment, a edge termination structure 309 may be prevented from being adversely affected.

A front surface of the semiconductor substrate 320 is constituted by the n-type silicon carbide layer 325 that constitutes the second n-type layer 306 in the active region 31, and is constituted by the n⁻-type silicon carbide layer 323 that constitutes the n⁻-type drift layer 304 in the edge termination region 32. A rear surface of the semiconductor substrate 320 is constituted by the p-type starting substrate 301. The first and the second p-type layers 302, 305 are doped with, for example, aluminum as a p-type impurity. The second n-type layer 306 is doped with, for example, nitrogen as an n-type impurity. At the front surface of the semiconductor substrate, the silicon carbide layers 324, 325 in the edge termination region 32 are removed, whereby similarly to the first embodiment, the recess (concave on a p-type starting substrate 301 side) 13 at which the edge termination region 32 is lower than the active region 31 is formed.

As a result, the third n⁻-type layer 312 of the n⁻-type drift layer 304 is exposed by the recess 13, at the front surface of the semiconductor substrate in the edge termination region 32. Similarly to the first embodiment, the edge termination structure 309 is provided in a surface layer of the third n⁻-type layer 312, the surface layer having an exposed surface in the edge termination region 32. Of plural p-type regions that constitute the edge termination structure 309, a p-type region that is closest to the active region 31 is in contact with the second p-type layer 305, at a pn junction surface between the second p-type layer 305 and the n⁻-type drift layer 304, i.e., the pn junction surface 331 in the npnp diode that constitutes the GTO thyristor. The second p-type layer 305 is in contact with a gate electrode 313 via a p⁺-type gate contact region 307 and is at an electric potential G of the gate electrode 313.

For example, a surface of the second p-type layer 305 may be exposed at the front surface of the semiconductor substrate 320 by a recess 13' (concave on the p-type starting substrate 301 side) at which an edge termination region 32 side of the active region 31 is lower than a center portion side of the active region 31. The p⁺-type gate contact region 307 may be selectively provided in a surface layer of the second p-type layer 305, the surface layer having the exposed surface in the active region 31. An n⁺-type cathode contact region 308 is selectively formed in the second n-type layer 306. The second n-type layer 306 is in contact with a cathode electrode 314 via the n⁺-type cathode contact region 308 and is at an electric potential K of the cathode electrode 314. The p-type starting substrate 301 is in contact with an anode electrode 315 and is at an electric potential A of the anode electrode 315.

A method of manufacturing the silicon carbide semiconductor device according to the third embodiment will be described. First, the silicon carbide layers 321, 322 constituting the first p-type layer 302 and the first n-type layer 303 are formed on the p-type starting substrate 301 by epitaxial growth. Next, the first n⁻-type layer 310, the second n⁻-type layer (n⁻-type lifetime reduced layer) 311, and the third n⁻-type layer 312 are sequentially and successively formed by epitaxial growth as the n⁻-type drift layer 304, on the n-type silicon carbide layer 322 that constitutes the first n-type layer 303, whereby the n⁻-type silicon carbide layer 323 is formed. A method of forming the first to the third n⁻-type layers 310 to 312 is similar to that in the first embodiment.

In this state, the first and the second detection electrodes (not depicted) are put in contact with the pn junction surface 331 of the third n⁻-type layer 312 and CV measurement for detecting the n⁻-type lifetime reduced layer 311 is performed. In the CV measurement, negative voltage is applied to the third n⁻-type layer 312 via the first detection electrode and positive voltage is applied to the third n⁻-type layer 312 via the second detection electrode, whereby a depletion layer in the n⁻-type drift layer 304 spreads from the interface (the pn junction surface 331 of the third n⁻-type layer 312) between the first detection electrode and the third n⁻-type layer 312. As a result, the thickness t311, the vanadium concentration, and the distance d311 from the pn junction surface between the second p-type layer 311 and the n⁻-type drift layer, of the n⁻-type lifetime reduced layer 311 may be detected.

Next, after the semiconductor substrate for which the CV measurement has be performed is cleaned, the silicon carbide layers 324, 325 constituting the second p-type layer 305 and the second n-type layer 306 are sequentially formed on the pn junction surface 331 of the third n⁻-type layer 312, by epitaxial growth. Next, by a photolithography process and etching, a portion of the silicon carbide layers 324, 325 (i.e., the second p-type layer 305 and the second n-type layer 306) is removed, exposing the pn junction surface 331 of the third n⁻-type layer 312 in the edge termination region 32. As a result, the semiconductor substrate 320 is fabricated in which the silicon carbide layers 321 to 325 are sequentially formed on the p-type starting substrate 301 by epitaxial growth and the recess 13 at which the edge termination region 32 is lower than the active region 31 is present on the front surface.

Next, a process that includes a photolithography process and ion implantation as one set is repeatedly performed, whereby the p⁺-type gate contact region 307 is selectively formed in the second p-type layer 305. The n⁺-type cathode contact region 308 is selectively formed in the second n-type layer 306. Additionally, plural p-type regions constituting the edge termination structure 309 are selectively formed in the third n⁻-type layer 312. Then, all the regions that are formed by ion implantation are activated by thermal activation annealing in an argon atmosphere. Thereafter, by a general method, a field oxide film (not depicted), the cathode electrode 314, the anode electrode 315, and the gate electrode 313 are formed, whereby the IGBT depicted in FIG. 13 is completed.

As described, according to the embodiments above, the n⁻-type lifetime reduced layer that is doped with vanadium as a carrier lifetime killer is provided in the n⁻-type drift layer, at a position that is deeper from the pn junction surface between the p-type anode layer and the n⁻-type drift layer in a direction toward the cathode side than is a predetermined depth. The carrier lifetime of the lifetime reduced layer that is selectively formed in the n⁻-type drift layer, as described above, is measurable by CV measurement and therefore, quality of the carrier lifetime of the lifetime reduced layer may be evaluated by non-destructive inspection (inspection to evaluate the internal structure of the semiconductor chip without cutting, etc.).

Further, according to the embodiments above, the n⁻-type lifetime reduced layer is provided separated from the pn junction surface between the p-type anode layer and the n⁻-type drift layer, whereby adverse effects on the activation rate of the p-type regions constituting the edge termination structure may be suppressed, enabling formation defects of the edge termination structure to be suppressed. Thus, according to the embodiments, quality management of the lifetime reduced layer is enabled and device performance may be enhanced.

In the present invention, without limitation to the embodiments described above, various modifications are possible within a range not departing from the spirit of the invention. For example, in the embodiments above, dimensions and impurity concentrations of regions may be set according to necessary specifications. Further, as the carrier lifetime killer for forming the n⁻-type lifetime reduced layer, instead of vanadium, an element may doped that reduces the carrier lifetime of the n⁻-type drift layer and functions as an acceptor, thereby compensating the n-type doping concentration of the n⁻-type drift layer at a constant rate in an increasing direction thereof.

Further, as described, after the semiconductor substrate having the n⁻-type lifetime reduced layer in the n⁻-type epitaxial layer constituting the n⁻-type drift layer is fabricated, a predetermined device structure is formed in the semiconductor substrate by a general method, whereby the silicon carbide semiconductor device according to the present invention is fabricated. In the fabrication of the silicon carbide semiconductor device according to the present invention, a carbon diffusion process for the n⁻-type epitaxial layer that constitutes the n⁻-type drift layer suffices to be performed at a certain timing after formation of the n⁻-type epitaxial layer that constitutes the n⁻-type drift layer.

According to the invention described, the quality of the carrier lifetime of the first-conductivity-type layer selectively formed in the first-conductivity-type epitaxial layer may be evaluated non-destructively by CV measurement. Further, according to the invention above, formation defects of the edge termination structure due to the second element doped in the first-conductivity-type layer are suppressed, further enabling suppression of the reverse recovery current peak and reduction of switching loss.

The silicon carbide semiconductor device and the method of manufacturing the silicon carbide semiconductor device according to the present invention achieve an effect in that quality management of the lifetime reduced layer is enabled and device performance may be enhanced.

As described, the silicon carbide semiconductor device and the method of manufacturing the silicon carbide semiconductor device according to the present invention are useful for devices having a pn junction through which forward current flows such as pin diode, a parasitic diode of a MOSFET, an IGBT, a GTO thyristor, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having a pn junction surface through which forward current flows, the silicon carbide semiconductor device comprising:
    a starting substrate;
    a first-conductivity-type epitaxial layer that is made of silicon carbide containing, as an impurity, a first element that is a dopant of a first conductivity type, and that includes, in the order recited, a first first-conductivity-type epitaxial layer disposed proximate to the starting substrate; a second first-conductivity-type epitaxial layer disposed on the first first-conductivity-type epitaxial layer; and a third first-conductivity-type epitaxial layer disposed on the second first-conductivity-type epitaxial layer; and
    a second-conductivity-type epitaxial layer that is made of silicon carbide containing a dopant of a second conductivity type and that has the pn junction surface provided between the second-conductivity-type epitaxial layer and the first-conductivity-type epitaxial layer so that minority carriers are supplied to the first-conductivity-type epitaxial layer,
    wherein the second first-conductivity-type epitaxial layer contains, as impurities, the first element and a second element, vanadium, that forms a recombination center therein, and is positioned at a first depth that is separated from and deeper than 5 μm from the pn junction surface in a direction toward the first first-conductivity-type epitaxial layer, and is disposed in a range from the pn junction surface to a second depth that is ⅓ times a thickness of the first-conductivity-type epitaxial layer,
    wherein the third first-conductivity-type epitaxial layer contains more of the first element than does the second first-conductivity-type epitaxial layer due to a depth distribution of a first-conductivity-type doping concentration of the first-conductivity-type epitaxial layer; and
    wherein the second element of the second first-conductivity-type epitaxial layer has a concentration that ranges from 1/100 to ⅕ of the concentration of the first element of the second first-conductivity-type epitaxial layer.

2. The silicon carbide semiconductor device according to claim 1, wherein the third first-conductivity-type epitaxial layer does not contain the second element and has a carrier lifetime that is at least 10 μs.

3. The silicon carbide semiconductor device according to claim 1, wherein the silicon carbide semiconductor device is any one of a PiN diode, a metal oxide semiconductor field effect transistor (MOSFET), an insulated gate bipolar transistor (IGBT), and a gate turn-off (GTO) thyristor.

4. A method of manufacturing the silicon carbide semiconductor device according to claim 1, the method comprising:
   applying a predetermined voltage between both surfaces of the first-conductivity-type epitaxial layer effective to cause a depletion layer in the first-conductivity-type epitaxial layer to spread; and
   obtaining a depth distribution of a first-conductivity-type doping concentration of the first-conductivity-type epitaxial layer, based on an amount of change in capacitance of the depletion layer.

* * * * *